United States Patent [19]

Hsiung et al.

[11] Patent Number: 4,933,641

[45] Date of Patent: Jun. 12, 1990

[54] EXTENDED DYNAMIC RANGE LOGARITHMIC IF AMPLIFYING APPARATUS AND METHOD

[75] Inventors: James M. Hsiung, Thousand Oaks; John J. Kotrba; Duveen J. Rivera, both of Los Angeles, all of Calif.

[73] Assignee: ITT Corporation, New York, N.Y.

[21] Appl. No.: 288,525

[22] Filed: Dec. 22, 1988

[51] Int. Cl.⁵ ............................................. G06G 7/24
[52] U.S. Cl. ........................... 328/145; 307/490; 307/492
[58] Field of Search ............... 328/145; 307/490, 492, 307/310

[56] References Cited

U.S. PATENT DOCUMENTS

| | | | |
|---|---|---|---|
| 3,108,224 | 10/1963 | Bradsell | 328/145 |
| 3,403,347 | 9/1968 | Stull, Jr. | 328/145 |
| 3,435,353 | 3/1969 | Sauber | 328/145 |
| 3,502,903 | 3/1970 | Wade | 328/145 |
| 3,509,368 | 4/1970 | Pedersen | 328/145 |
| 3,571,618 | 3/1971 | Inacker | 328/145 |
| 3,624,409 | 11/1971 | Folsom | 328/145 |
| 3,745,374 | 7/1973 | Hecker et al. | 307/230 |
| 3,745,474 | 7/1973 | Hughes | 328/145 |
| 3,971,984 | 7/1976 | Bench | 328/145 |
| 4,091,329 | 5/1978 | Fletcher et al. | 328/145 |
| 4,531,069 | 7/1985 | Parker | 328/145 |
| 4,691,381 | 9/1987 | Bollard | 455/334 |
| 4,758,793 | 7/1988 | Sheade et al. | 328/145 |

Primary Examiner—Stanley D. Miller
Assistant Examiner—T. Cunningham
Attorney, Agent, or Firm—Thomas N. Twomey

[57] ABSTRACT

A logarithmic I.F. amplifier having a common input terminal for receiving input signals with the method of construction including a pair of channels connected in a parallel configuration, the first channel being non-attenuated for receiving an input signal at full signal strength while the second channel is attenuated for substantially reducing the power level of the input signal, the construction resulting in saturation of a plurality of successive amplifying stages of the non-attenuated channel with increasing input signal strength prior to the delayed saturation of a plurality of duplicate amplifying stages of the attenuated channel, the attenuated channel continuing to provide compressed output signal data after the saturation of the amplifying stages of the non-attenuated channel, the sum of the output signal data from the pair of channels being effected on a summation line for providing an extended dynamic range of the logarithmic I.F. amplifier. An alternative embodiment is disclosed exhibiting fewer successive amplifying stages per channel and an improved temperature compensation design.

23 Claims, 8 Drawing Sheets

EXTENDED DYNAMIC RANGE LOGARITHMIC IF AMPLIFYING APPARATUS AND METHOD

BACKGROUND OF THE INVENTION

This invention relates to logarithmic intermediate frequency (I.F.) amplifiers for use in radar receivers, and more particularly, to logarithmic I.F. amlifiers having duplicate amplifier stages in a parallel connection employed for extending the overall dynamic range of the amplifier for distinguishing a received amplified signal from background clutter signals.

Logarithmic I.F. amplifiers have been known in the past. A technique known as the Successive Detection Method which employs tandem detection stages for achieving logarithmic detection of I.F. signals is also well known. This technique is now the most common method utilized for building log I.F. amplifiers for military and commercial applications.

Generally, the logarithmic response is obtained by cascading linear I.F. amplifier stages, each having comparable quality limiting and detection characteristics. An approximation of a logarithmic video output signal is obtained by summing the contribution of each stage on a common summing line. The theory of operation is well documented in professional literature on the subject.

Commercially available logarithmic I.F. amplifiers designed to operate within the frequency range of 10 megahertz (MHz) to 1000 megahertz (MHz) can be readily purchased with such amplifiers having up to a 80 decibel (dB) dynamic range and a ±1.0 dB logarithmic linearity. The dynamic range is a measure of how much the received input signal power data can be compressed without deviating from the logarithmic relationship between the received input signal and the output amplified signal. This definition is based upon the general purpose of the log amp which is to compress or shrink for representation purposes a large input dynamic range into a much smaller output dynamic range.

Such a general purpose permits a large amount of gathered data to be processed by a method that improves the simplicity and utility of the gathered data. For example, if the received data were plotted on a linear milliwatt scale against the voltage output of the log amp, a very non-linear transfer function would result. However, if the axis representing the received power was converted to a logarithmic decibel scale having a conversion factor of 1 milliwatt equivalent to zero dBm, the non-linear transfer characteristic would be converted to a linear response. The range of the linear response of the characteristic curve is used to define the dynamic range of the log amplifier.

Thus, the range of linearity of the log amp provides predictability in the linear relationship between the received input power signals (dBm) and the output signal (volts) of the log amp. Because a dynamic range of 20 dB compresses a 100:1 input signal and a 40 dB dynamic range compresses a 10000:1 input signal, the log amp is very useful in identifying and amplifying weak radio signals.

However, the amplification and detection of a received signal is limited by the dynamic range of the log amp being utilized. Suppose a voltmeter employs a scale factor of 10 dB/volt such that a one volt change on the voltmeter output represents a 10 dB change in the input power. If on a first reading, the voltmeter indicates (+2) volts which translates into (−50) dBm on the linear transfer characteristic curve of the log amp and on a second reading, the voltmeter indicates (+4) volts which translates into (−30) dBm, a two volt output change has resulted from a 20 dB variation in the input power. By employing the scale factor of 10 dB/volt, the 20 dB or 100:1 power variation in compressed into a 2:1 output change on the indicator. This is the case since a 20 dB dynamic range provides data compression in the ratio of 100:1. The scale factor is derived from the slope of the linear region of the transfer curve, derived from the well known equation for a straight line $$Y = mx + b \qquad (1)$$

where "m" represents the slope and "b" represents the "Y-axis" intercept.

A second parameter utilized as a measuring stick for the quality of a logarithmic amplifier is referred to as the log linearity. Such a measurement is defined as the amplitude of deviation of the actual characteristic within the dynamic range of the amplifier compared to the actual straight line of an ideal logarithmic response. This measurement addresses the accuracy of the linear characteristic and how far a distance measured in decibels the actual curve deviates from true log response. In this industry, a log linearity of ±1.0 dB is acceptable.

A further factor relates to the parameter referred to as the tangential sensitivity. The tangential sensitivity relates to a point located at the bottom portion of the log curve where the characteristic curve is no longer logarithmic. Beyond this point, the response is linear and not logarithmic and the transfer response is no longer a straight line. The point at which the logarithmic portion of the curve terminates and the linear portion begins is referred to as the lin-log crossover point.

A problem that continues to exist is that of the capability of the log amp to amplify and detect a received signal in the presence of high background "clutter." Clutter is generally defined as signals returned to a radar receiver (and the log amp located therein) which are reflected from objects of little interest. Examples of clutter include returned signals from the sea, land mass or even rain droplets. These returned signals may be very strong and tend to obscure signals returned from objects of interest such as aircraft. These signals are actually undesirable and in order for the log amp to recognize a returned signal of interest, such signal of interest must be stronger than the background clutter. The dynamic range of the log amp in decibels must be greater than the amplitude of the clutter to prevent the log amp from saturating and to permit detection of desired radio signals.

Therefore, to overcome this significant problem, a logarithmic amplifier with an extended dynamic range is necessary. This is the case because if the sea clutter in a specified vicinity has a magnitude of 80 dB, a log amp having only an 80 dB dynamic range cannot distinguish targets from the sea clutter in the specified vicinity.

Log I.F. amplifiers with extended dynamic ranges have not been developed in the past because the need for extended dynamic ranges greater than 80 dB had not previously been identified. However, the need to develop I.F. modules required to extend the dynamic range of, for example, a shipboard radar receiver was identified. In particular, in order to avoid saturation of the radar receiver in the presence of 80 dB sea clutter, extended dynamic range log amplifiers were required for detecting low flying targets. Specifically, low flying aircraft return or reflect low angle signals as a result of their position. The low antenna pointing angle required to detect these signals produce strong radar returns from the sea which tend to drive the logarithmic amplifier into saturation.

As an example, assume that the amplitude of a large clutter signal is −20 dBm. Under these conditions, the logarithmic amplifier output in volts is in saturation wherein this condition results in no additional output in volts being produced for an increased increment in the input power level in dBm. Even if a target of interest produces a signal having a power level of −10 dBm, the log amp cannot distinguish between the target and the clutter because the amplifier is in saturation. Therefore, the increased signal strength of 10 dB produces no additional incremental output signal in volts and is thus undetectable. It is necessary to provide a log amp having an extended linear range in order to detect targets having an amplitude greater than the sea clutter.

To achieve this goal, it was estimated that a log I.F. amplifier having a 105 dB dynamic range was required in order to operate the radar receiver with the system noise level set at least 15 dB above the lin log crossover point. With this in mind, a log I.F. amplifier having an 85 dB dynamic range from 25 MHz to 37 MHz had already been achieved. Such an amplifier had employed a plurality of cascaded stages in the Successive Detection Scheme.

In an effort to procure a 105 dB log I.F. amplifier from the commercial market, it was found that such an amplifier was not available. Different methods to extend the dynamic range of log I.F. amplifiers had been proposed but none had been implemented or since developed. In particular, an 85 dB log I.F. amplifier known in the past extended the dynamic range from −75 dBm up to +10 dBm employing the cascaded scheme. The limit level of the cascaded stages was on the order of −10 dBm, and the dynamic range had been extended by adding an attenuator and a unity gain limiter at the input. Further, the value of the first and last stage summing resistors were empirically selected for smoothing the logarithmic curve at the upper and lower ends of the curve. The noise figure of the amplifier had been degraded by the addition of the resistive attenuator at the input stage. Further, the 85 dB dynamic range obtained with this prior art amplifier was the highest logarithmic range achievable over the desired 20 MHz bandwidth using the Successive Detection Method.

Logarithmic amplifiers known in the past reflect a wide variety of design applications. An example included a solid state logarithmic amplifier and limiter device which employed seven logarithmic stages to achieve a 70 dB logarithmic range without utilizing vaccum tubes or diodes. Input voltage to the amplifier was attenuated and amplified in separate channels for producing seven logarithmic currents which were summed to produce the logarithmic amplified and limited output.

The invention consisted of several identical stages having output currents which were summed in parallel to provide a logarithmic output of a linearly increasing input signal. Logarithmic behavior over a wide range of input signals was obtained by attenuating the input voltage and amplifing the input voltage in separate channels, and then adding the logarithmic output currents. In addition, the gain of the amplifier was such as to provide a limited output over the desired input range which assisted in perserving phase information.

By inspection of the circuitry, it is noted that parallel channels are employed to extend the dynamic range of the amplifier. The channel employed for extending the dynamic range, normally referred to as the high level channel, is comprised of a cascade of attenuators each having a logarithmic current amplifier associated therewith. However, the low level channel positioned in a parallel combination with the high level channel includes only a logarithmic amplifier at each stage so that identical amplifying stages may not be employed in both the high level and the low level channels.

This particular invention permitted the logarithmic dynamic range to be extended to 70 dB which, by present standards, is modest. Further, this amplifier operates in the range of 1.1 MHz but does not indicate the maximum input power level that can be processed by the amplifier.

Another example of a logarithmic amplifier known in the past was a multistage, parallel summation, logarithmic video amplifier. This amplifier was capable of processing very short pulses in which linear amplifiers were utilized in each stage as a delay device such that all of the stages simultaneously provided an output signal in response to each input pulse. Typically, a parallel summation, logarithmic video amplifier of the past was multistage with each stage comprised of a linear amplifier, an attenuator coupled to the linear amplifier, and a logarithmic amplifier coupled to the attenuator. Each successive stage was also coupled to the linear amplifier of the preceeding stage while the outputs of all the logarithmic amplifiers were summed to form the response which approximated the logarithmic function of the input signal.

When the input signal was an ultrashort pulse, the typical logarithmic video amplifier was unable to provide a meaningful output because of the inherent delays in the system. Therefore, in order to overcome this problem, a delay line comprised of one or more linear amplifiers was selectively added to each stage so that the output of the stages was made to occur simultaneously in response to each input pulse. The number of linear amplifiers added to each stage was equal to the number of succeeding stages.

It should be noted that the logarithmic video amplifier of the second example is distinguishable from a logarithmic I.F. amplifier providing video detection and from a true logarithmic I.F. amplifier with no detection. It is sometimes difficult to distinguish between the structures, however, circuit details usually resolve any ambiguities. For example, circuits which employ operational amplifiers in the input signal path are usually not RF/IF devices and therefore imply video amplifiers such as the one described hereinabove. Further, the paralleling approach employed was not for the purpose of extending the logarithmic dynamic range for high level signals but was utilized for managing time delays.

A third example of amplifiers known in the past included a receiver employed for measuring the amplitude of input amplitude modulated signals which exceeded an 80 dBm range and which produced a digital output. The amplifier comprised a power splitter to which an input signal was applied via a limiter. First and second video detectors were coupled through the power splitter and in the case of the second video detector, an R.F. linear amplifier was connected in the signal path for providing an overall 40 dB of gain relative to the input of the first video detector. Each video detector comprised a detector stage having an output connected to a chain of amplifiers with each amplifier having a gain of ten. The outputs of the detector stage and the amplifiers were quantized and applied to a logarithmic analog-to-digital converter. The outputs of the respective converters were then applied to a combiner.

A recited objective of this invention was to provide a compact, less expensive amplitude measuring receiver which did not employ an analog logarithmic amplifier. This was accomplished by employing a receiver which exhibited two parallel channels with each channel responding to adjacent segments of the total dynamic range. It is noted that the range of each channel is scaled by a 40 dB amplifier instead of an attenuator. Further, the actual logarithmic conversion is accomplished by utilizing a signal video detector in each channel followed by a logarithmically weighted A/D converter instead of employing a cascaded succession of detection stages. Finally, the detected outputs are combined by employing a digital algorithm in lieu of continuous analog summation.

A fourth example of an apparatus known in the past included a radar receiver having as an objective to provide a simple radar receiver which included a radar display used for identifying storm centers. Particularly, the display would have a number of bright patches indicating storm regions with the bright patches having dark patches located within them for indicating the violent storm regions. This information permitted aircraft carrying such radar receivers to steer clear of such storm regions. A further objective of the radar receiver was to be readily arranged to vary the amplitude of the received radar signal at the point at which the brightness of the display began to decrease. This occurred with an increase in the amplitude of the received signal. In particular, a superheterodyne radar receiver was provided wherein the intermediate frequency stage split into two separate amplifying channels. The output signals of the channels were detected and combined in opposition to provide a display-intensity control signal. In order to obtain a greater dynamic range in the control signal, both channels exhibited logarithmic characteristics such that if the output signal was plotted on a linear scale against the input signal on a logarithmic decibel scale, a substantially straight line was obtained.

The receiver included a pair of channels in which a first channel was identified as including a first amplifier and a first detector while the second channel was identified as including the first amplifier, a second amplifier and a second detector. The two channels were combined in a parallel combination similar to parallel channels used in known log amplifiers. However, the major difference in the parallel channels employed in this fourth example was that they were combined in opposition for the purpose of obtaining a desired transfer response. Such a transfer response resulted in a reduction in the output parameter to high level signals and was not for the purpose of extending the overall dynamic range.

The fifth and final example included a logarthmic circuit which derived an output voltage proportional to the logarithm of a DC input voltage susceptible to wide variations in amplitude. The circuit included a constant current source which forward biased a diode such that the diode operated in the exponential portion of its voltage-current characteristic above the saturation current. The constant current source included first and second, cascaded feedback, DC operational amplifiers connected in a negative feedback circuit. An input terminal of the first amplifier was responsive to the input voltage and a circuit shunting the first amplifier output terminal included a resistor in series with the diode. The voltage across the resistor was sensed at the input of the second DC operational feedback amplifier. The feedback voltage derived from the output of the second amplifier was substracted by the first amplifier from the input voltage. This permitted the current flowing through the resistor to be proportional to the input voltage over a wide range of variations and amplitudes of the input voltage. This circuit was also a logarithmic video amplifier which did not provide intermediate frequency detection.

Hence, those concerned with the development and use of radar receiving systems in the surveillance field have long recognized the need for improved logarithmic I.F. amplifiers which extend the dynamic range of the amplifier for processing higher power input signals received from objects of interest with the dynamic range being extended at both ends of the transfer characteristic to a maximum peak not previously achieved. Further, the linearity of the logarithmic amplifier extended dynamic range must be maintained within a limited decibel range for minimizing the error of the logarithmic curve while simultaneously incorporating temperature compensation circuitry for improving the stability of the log amp curve over a variety of temperature ranges which minimizes the linearity error. Further, simplified circuitry is needed for promoting economy and commonality for permitting the employment of identical cascaded stages in both the high level and low level channels. The present invention fulfills all of these needs.

SUMMARY OF THE INVENTION

Briefly, and in general terms, the present invention provides a new and improved logarithmic intermediate frequency (IF) amplifier construction which substantially extends the dynamic range at both ends of the transfer characteristic to a maximum peak not previously achieved permitting identification of received signals having magnitudes greater than relatively large background clutter, and which permits processing of higher power input signals received from objects of interest by virtue of extending the dynamic range of the logarithmic amplifier. Moreover, the amplifier construction of the present invention is limited to approximately a 1.6 dB linearity variation for minimizing error in the log curve, employs identical stages in both the high level and low level channels for promoting economy and commonality, and in one embodiment utilizes temperature compensation circuitry for improving performance stability over various temperature ranges.

Basically, the present invention is directed to an improved logarithmic amplifier and method of construction for extending the dynamic range at both ends of the transfer characteristic to a maximum peak not previously achieved permitting the processing of higher power received input signals. This is accomplished by employing the successive detection technique in a modified form by utilizing parallel channels, each comprised of successive identical stages.

In accordance with the invention, the returned input signal is divided at a node with part of the signal being directed to a low level channel which processes the input at full signal strength and drives the low level channel toward saturation. The remaining portion of the signal is attenuated reducing the input power level prior to being directed to a high level channel which continues to process the input signal after the low level channel saturates resulting in an extended dynamic range.

In accordance with the improved method of the present invention, the two channels are identical in construction, however, the high level channel is attenuated for reducing the dB power input by a substantial amount so that the initial signal strength of the high level channel is less than the signal strength of the low level channel. Upon increasing the input power level, the non-attenuated channel will saturate first terminating the amplifying and detecting process in the low level channel. The attenuated channel receives a signal with a reduced power level which delays the initial response and thus continues to process amplified information after saturation of the non-attenuated channel. The sum of the outputs of the two channels result in an extended dynamic range.

The new and improved logarithmic IF amplifier and method of construction of the present invention substantially extends the dynamic range at both ends of the transfer charateristic to a maximum peak not previously achieved permitting the amplifier to detect received signals having a greater magnitude than the background clutter. Further, the extended dynamic range significantly improves the capability of the amplifier to process higher power input signals received from objects of interest. Additionally, the amplifier construction limits the variations of the logarithmic curve for minimizing error and permits employing identical stages in both the high and low level channels for enhancing the economic features of the amplifier. Temperature compensation is incorporated into the amplifier and in one embodiment improves performance stability over various temperature ranges.

These and other features and advantages of the invention will become apparent from the following more detailed description, when taken in conjunction with the accompanying drawings, which illustrate, by way of example, the features of the invention.

BRIEF DESCRIPTION OF THE DRAWINGS

FIG. 3 is a block diagram of a logarithmic intermediate frequency amplifier in accordance with the present invention;

DETAILED DESCRIPTION OF THE INVENTION

Figure 1:
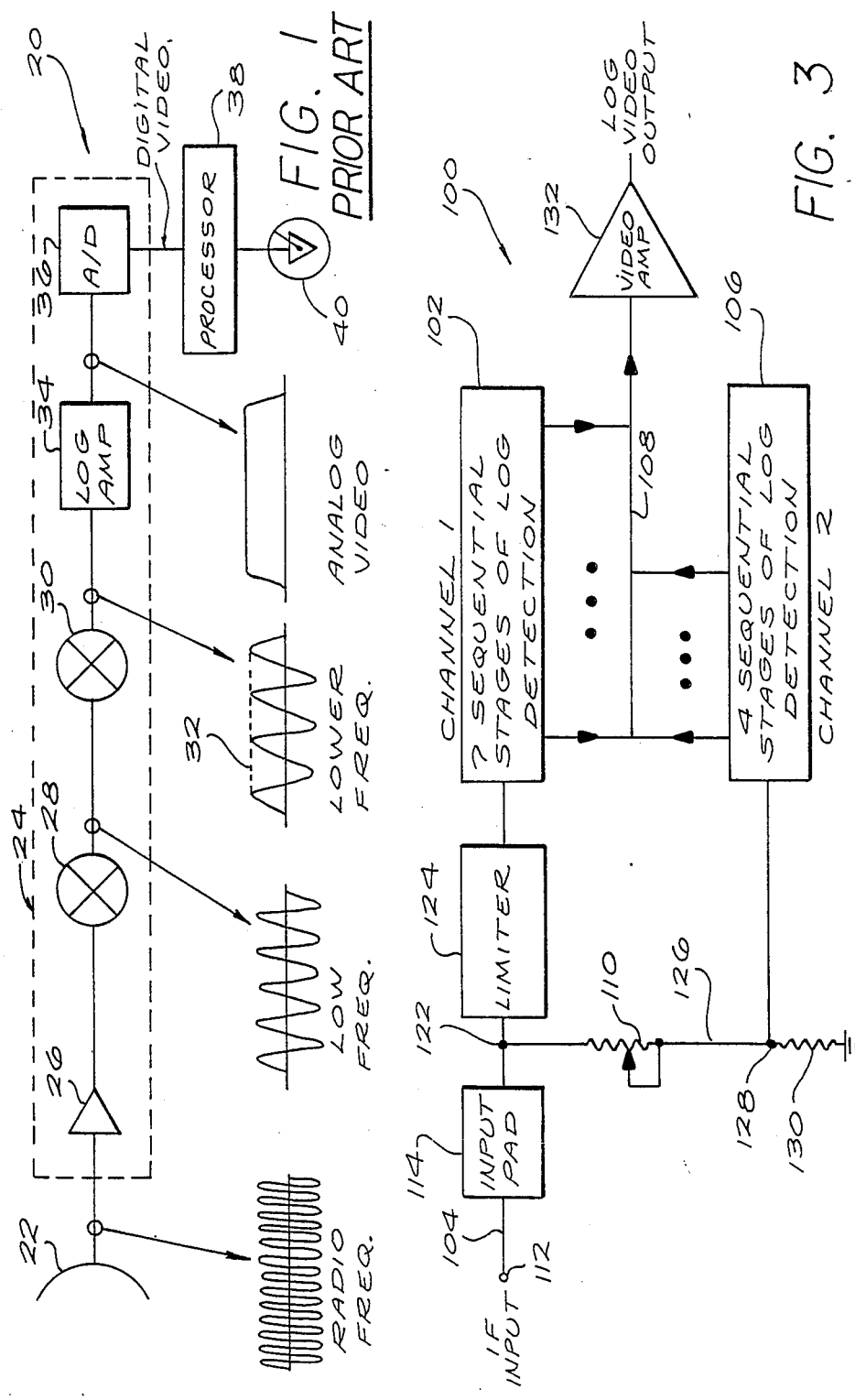
FIG. 1 is a generalized block diagram of a radar receiver-processor of the prior art.

As shown in the drawings for purposes of illustration, the invention is embodied in a logarithmic immediate frequency (I.F.) amplifier 100 of the type employing a modified successive detection technique having a non-attenuated channel 102 for processing input signals 104 of low power levels and a parallel connected attenuated channel 106 for processing input signals of higher power levels with each channel having an output signal, the addition thereof on a summation line 108 extending the dynamic range of the amplifier.

Generally, logarithmic amplifiers have been known in the past and were employed for compressing an extensive amount of input data into a much smaller amount of output data. This resulted in the amplifier transfer curve exhibiting a linear relationship between the input power signal and the output voltage signal for conveniently displaying the compressed data in a graphical representation. Generally, the two quantities employed for measuring the quality of the logarithmic amplifier are the dynamic range of the amplifier and the logarithmic linearity exhibited on the graphical representation.

Logarithmic characteristics are exhibited when the output signal is plotted on a linear scale against an input signal plotted on a logarithmic (decibel) scale and the plotted curve is substantially a straight line. The challenge is to extend the dynamic range of the logarithmic amplifier to enable the amplifier to identify and process a received input signal having a magnitude greater than the background clutter with the input signal magnitude being sufficient to drive the logarithmic amplifier into saturation. Once driven into saturation, the log amp is incapable of distinguishing between the input power signal of a target versus a returned background signal from, for example, sea clutter.

Generally, a logarithmic amplifier is only a single component included within the circuitry utilized for intercepting a returned input signal and for displaying the information or intelligence carried by the input signal. An example of a generalized receiving circuit 20 includes a signal receiving antenna 22 for receiving low level radio frequency pulses which are delivered to a receiver circuit 24 as shown in FIG. 1. Receiver circuit 24 is comprised of a radio frequency (R.F.) amplifier 26 employed for amplifying received R.F. pulses.

Upon amplification, the R.F. pulse signal is subjected to frequency down conversion by a first mixer 28. Upon combining the amplified R.F. signal with a signal of a different frequency (not shown), a low frequency signal is provided as shown at the output of the first mixer 28. The low frequency signal is then transmitted to a second mixer 30 which combines the low frequency signal of the first mixer 28 with yet another signal of a different frequency (not shown) for providing yet a lower frequency signal as shown at the output of the second mixer 30. Note that the shape of the lower frequency signal at the output terminal of the second mixer 30 is that of an envelope 32. Further, the envelope 32 of the three signals at different frequencies remains the same.

The lower frequency signal appearing at the output of the second mixer 30 is fed to a logarithmic amplifier 34 employed for compressing the extensive amount of input signal data into a smaller amount of output voltage data. This function is indicated by the compressed pulse envelope labelled "analog video" which is also indicative of the construction of the logarithmic amplifier. The final stage of the receiver circuit 24 includes an analog-to-digital converter 36 also referred to as a "digitizer" utilized for converting the analog video envelope appearing at the output of the logarithmic amplifier 34 to the digital video signal appearing at the output of the converter 36. The digital video signal is then transmitted to a processor 38 which is employed for manipulating the signal in preparation for transmission to a display unit 40 which may be a florescent screen or a form of metering instrumentation.

Although logarithmic amplifiers may be designed for use in various frequency ranges, the intermediate frequency range of interest in this particular application include those frequencies developed by and transmitted from the second mixer 30 and the logarithmic amplifier 34.

An example of a logarithmic amplifier 34 known in the past included a solid state logarithmic amplifier and limiter device which employed seven logarithmic stages to achieve a 70 dB logarithmic range without employing vacuum tubes or diodes. The input signal voltage was attenuated and amplified in separate channels for providing seven logarithmic currents which were summed to produce the log amplified and limited output. The logarithmic and solid state amplifier 34 operated in the range of 1.1 MHz in which the output signal was in proportion to the logarithm of the input signal and to a limited output over a desired input range.

The main problem addressed by the solid state amplifier 34 was that conventional or other practical log amplifiers could not process high level signal inputs without providing a distorted output signal. The process of simple attenuation to the optium level degraded the noise figure to an unacceptable level.

Figure 2:
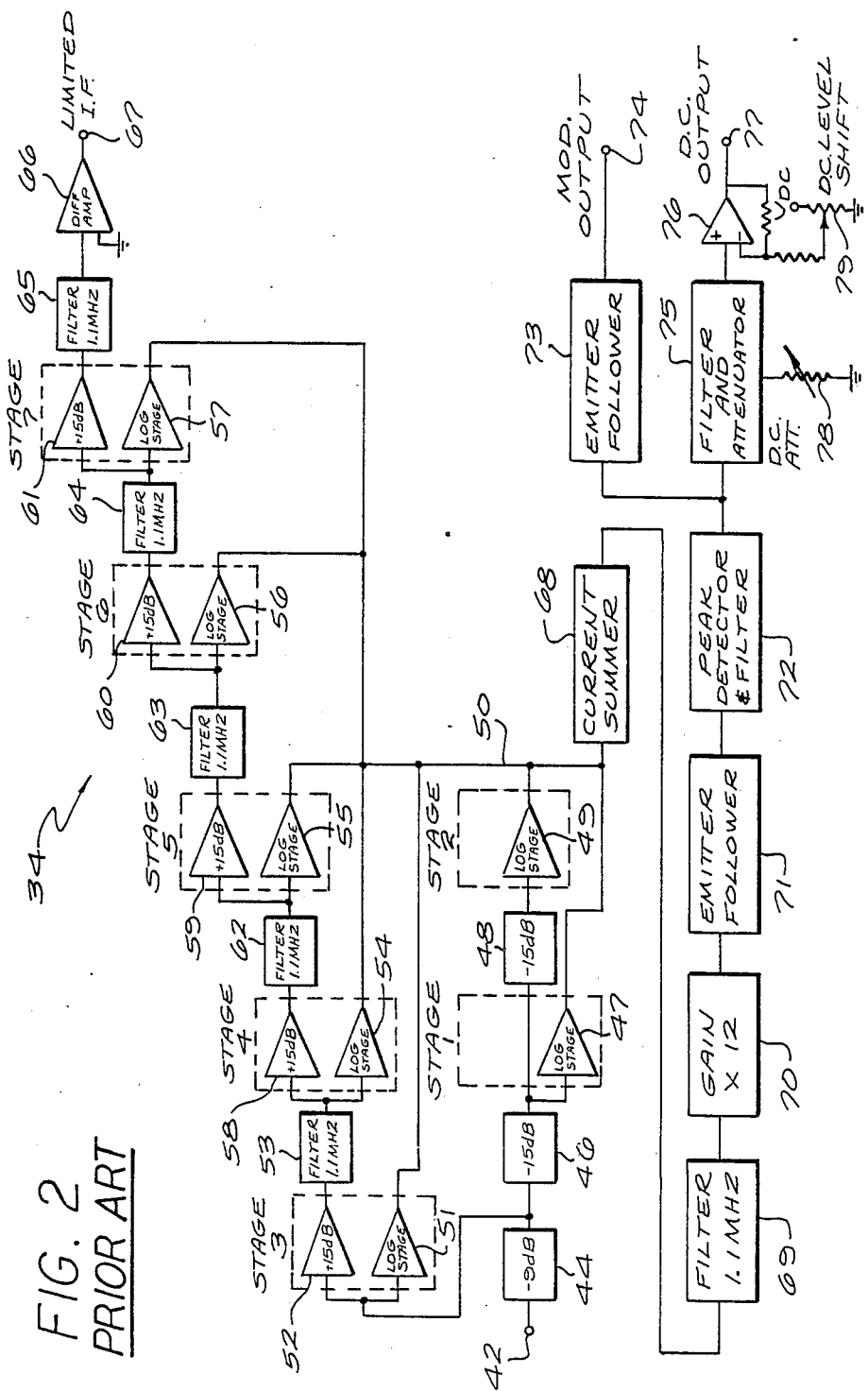
FIG. 2 is a block diagram of a logarithmic amplifier of the prior art.

Generally, the solid state amplifier 34 consisted of a plurality of amplifier stages having output currents which were summed in parallel to provide a logarithmic output of a linearly increasing input signal as is shown in FIG. 2. Logarithmic behavior over a wide range of input signals was obtained by attenuating the input voltage and amplifying the input voltage in separate channels and then adding the logarithmic output currents. The gain of the amplifier provided a limited output over the desired input range.

The circuitry included an input terminal 42 which delivered input signals to an attenuator 44 which attenuated the signal by 9 dB and then to an attenuator 46 which attenuated a signal by 15 dB. The attenuated signal was then delivered to a log amplifier 47 located in stage one of the seven stage amplifier. The output of the attenuator 46 was also fed to another 15 dB attenuator 48 which further attenuated the input signal and which was applied only to a logarithmic amplifier 49 located in stage two of the seven stage logarithmic amplifier 34.

The 9 dB attenuator 44 and the two stages of 15 dB attenuation 46, 48, permitted the logarithmic amplifier 34 to be used with signal levels too high for conventional amplifiers while maintaining low noise levels. This was accomplished by using several 15 dB gain stages in the parallel amplifier stages three through seven. Also, the two attenuation stages 46, 48 having 15 dB attenuation were scaled to be inverse to the parallel 15 dB gain stages. The 9 dB attenuator 44 was used to attenuate the input signal to the optimum stage level for log amplifier stages 47, 49 to insure the proper logarithmic characteristics without degrading the noise figure beyond allowable levels. Each of the logarithmic stages, in turn, delivered a logarithmic output current to a common point 50 as is shown in FIG. 2.

The output of the attenuator 44 was also applied to stage three of the logarithmic amplifier 34. The input signal to stage three was applied to a logarithmic amplifier 51 and to a 15 dB gain amplifier 52. The signal developed at the output terminal of the gain amplifier 52 was applied to a 1.1 MHz filter 53. As with stage three, the input signals to stages four, five, six, and seven were applied serially to logarithmic amplifiers 54, 55, 56 and 57 and to corresponding and parallel connected 15 dB amplifiers 58, 59, 60 and 61 as shown in FIG. 2.

Note that the output signal from stage three was directed from the 15 dB gain amplifier 52 to stage four via the filter 53 while each of the output signals directed from stages four, five, six and seven were transmitted from the respective 15 dB gain amplifiers 58, 59, 60 and 61 through a corresponding 1.1 MHz filter 62, 63, 64 and 65, respectively. The voltage input signals to stages three through seven were amplified and filtered and then applied to the succeeding stage. Further, the input voltages to stages three through seven produced output logarithmic currents which were connected to the common point 50.

The output signal from the 15 dB gain amplifier 61 and the respective filter 65 were then applied to a differential amplifer 66 which provided a limited I.F. signal at an output terminal 67. The total gain from the input terminal 42 to the differential amplifier 66 was 66 dB causing the differential amplifier 66 to square the input signal yielding a one volt peak-to-peak limited I.F. output signal at the output terminal 67. With the proper selection of frequency break points, the output signal also maintains phase information.

The seven logarithmic current output terminals connected to the common point 50 were each added in a current summer 68, applied through a 1.1 MHz filter 69, amplified in a gain amplifier 70, and passed through an emitter follower 71 to a peak detector and filter 72. The output signal was then directed through another emitter follower 73 for providing a modulator output signal at an output terminal 74.

The output signal of the peak detector and filter 72 was also applied to a combination filter and attenuator 75, the output of which was directed to a differential amplifier 76. Thus, the seven output currents of the logarithmic amplifiers were added, filtered, and amplified by approximately 20 dB with the peak-to-peak output signal at an output terminal 77 being a logarithmic function of the signal received at the input terminal 42. It should further be noted that a variable resistor 78 was utilized for adjusting the DC gain of the combination filter and attenuator 75 while a variable resistor 79 was used for adjusting the DC offset voltage of the differential amplifier 76. The DC output signal appearing at the output terminal 77 was a limited logarithmic value of the 1.1. MHz signal received at the input terminal 42.

Although the previously known circuit shown in FIG. 2 employed two parallel channels for extending the logarithmic dynamic range, the implementation of the parallel channels is distinctly different from that to be disclosed in the preferred embodiment of the logarithmic I.F. amplifier 100. It should be noted that stages one and two disclosed in FIG. 2 were not identical to stages three through seven in the parallel channel. Further, the channel comprised of stages one and two employed for extending the dynamic range of the logarithmic amplifier 34 consist of a cascade of attenuators 46, 48 and a corresponding logarithmic current amplifier 47, 49 associated with each. The construction of stages one and two was distinctly different from the construction of the parallel channel comprised of stages three through seven.

The 70 dB dynamic range provided by the logarithmic amplifier 34 is currently easily obtained with conventional successive detection techniques, and further, the amplifier 34 was not suitable for detecting and amplifying received signals larger than high background clutter. Further, there was no indication of the maximum input power level that could be processed by the circuit of the logarithmic amplifier disclosed in FIG. 2. Assuming that the minimum signal that could be processed by the logarithmic amplifier 34 was on the order of ($-70$ to $-80$) dBm, the highest level signal would approximately be 0 dBm. It is known that the logarithmic amplifier 34 operated at a frequency of 1.1 MHz. In view of the limited dynamic range of the logarithmic amplifier 34, an amplifier having an extensively increased dynamic range for permitting the detection and amplification of received signals having a magnitude greater than high background clutter has not been available until the present invention.

In accordance with the present invention, the non-attenuated channel 102 and the parallel connected attenuated channel 106 cooperate to extend the dynamic range of the logarithmic amplifier 100 at both ends of the transfer characteristic to a maximum peak not previously achieved permitting identification of received input signals 104 having a magnitude greater than the background clutter, and to significantly improve the capability of processing higher power input signals having a magnitude greater than the objects of interest. Further, the logarithmic amplifier is limited to approximately a 1.6 dB linearity variation for minimizing error in the log curve, employs identical stages in both the non-attenuated and the attenuated channels for promoting economy and commonality, and utilizes temperature compensation circuitry for improving thermal stability.

Because the logarithmic response was obtained by summing the contributions of cascaded stages, the addition of one or more stages in series would not result in an extended dynamic range of the amplifier because the additional gain would only amplify the self noise of the I.F. amplifier. However, it was found that the high end of the dynamic range could be extended by adding stages in the attenuated channel 106 in parallel with the cascaded stages of the non-attenuated channel 102 and then summing the contributions of both channels on the common summation line 108. Detection of higher level signals would be obtained from the stages of the parallel connected attenuated channel. This was accomplished by attenuating the input signals 104 to the attenuated channel 106 by means of a resistive attenuator 110 as is illustrated in FIG. 3.

This approach was verified by the design and construction of the log I.F. amplifier 100 and incorporating eleven stages therein. The design consists of seven sequential stages of logarithmic detection in a first channel described as the non-attenuated channel 102 and four sequential stages of logarithmic detection in a second channel identified herein as the attenuated channel 106.

Figure 4:
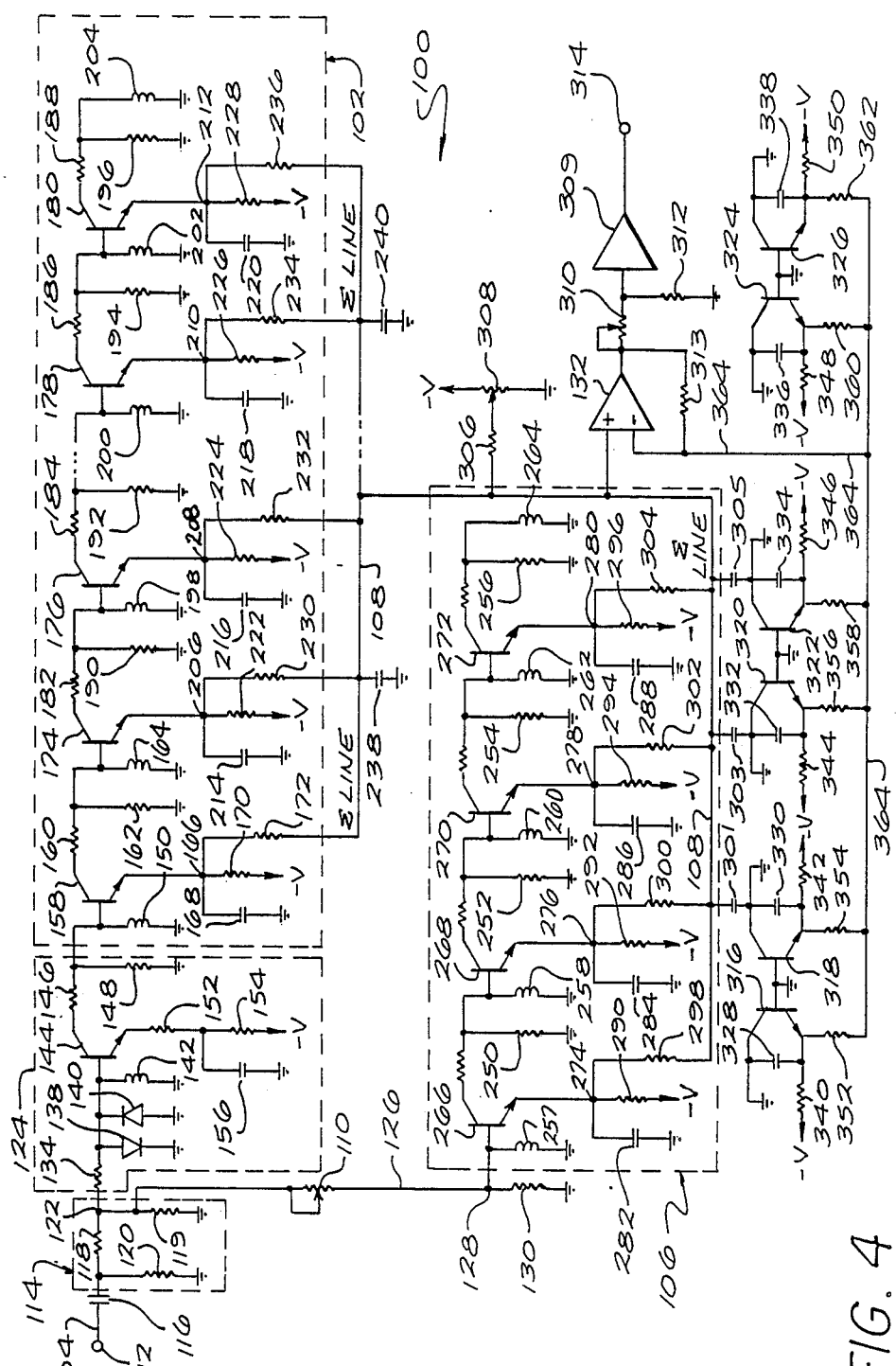
FIG. 4 is a circuit diagram of the logarithmic amplifier of FIG. 3.

The input signals 104 are received at an input terminal 112 and are comprised of the lower frequency signal as was disclosed in FIG. 1. The input signals are coupled and delivered to an input pad 114 via a capacitor 116. The input pad is comprised of a plurality of resistors utilized for attenuating the lower frequency signals prior to transmitting the input signals to either channel. The input pad includes a resistor 118 shunted by a pair of resistors 119, 120 connected to ground as is shown in FIGS. 3 and 4. The manipulated input signals 104 are then transmitted to a junction node 122 prior to being transmitted to either channel.

The novel logarithmic I.F. amplifier 100 extends the dynamic range to 110 dB by extending the logarithmic response to signals up to one Watt, or $+30$ dBm. Therefore, a limiter 124 is required to be placed between the input pad 114 and the non-attenuated channel 102 (also known as the low level channel) to prevent overload and avoid degradation in performance in the presence of such high level signals. The ability of the instant logarithmic amplifier to process signals up to and including one Watt is one of the many novel features of the instant invention.

Also connected to the node 122 is the resistive attenuator 110 which may be adjusted during calibration to control the reduction in the power level of the input signal prior to being transmitted to the attenuated channel 106 The signal available at the output of the limiter 124 is then transmitted to the non-attenuated channel 102 for being subjected to seven sequential stages of log detection. The resistive attenuator 110 reduces the power level of the input signals 104 and transmits an attenuated signal 126 to the attenuated channel 106 by way of a node 128. The node 128 is connected to electrical ground through a resistor 130 which is part of the attenuator circuitry with resistive attenuator 110.

The seven sequential stages of logarithmic detection included within the non-attenuated channel 102 is designed for processing the input signals 104 having a power level range of from ($-80$) dBm to approximately ($-10$) dBm which are generally referred to as low level signals. Therefore, the non-attenuated channel 102 or the low level channel includes more stages than the parallel connected attenuated channel 106 for providing additional amplification. Thus, the limiter 124 is necessary for restricting the incoming signal amplitude to a fixed level so that the first stage of the non-attenuated channel is not overloaded or damaged by high level input signals suitable for the attenuated channel.

The resistive attenuator 110 is specifically employed for reducing the magnitude of the input signals 104 directed to the attenuated channel 106. The attenuated channel has four sequential stages of log detection which are specifically employed for extending the dynamic range of the log amplifier 100. Therefore, to successfully extend the dynamic range by employing the parallel channel, the attenuator is designed to delay the initial response of the attenuated channel 106 behind the response of the non-attenuated channel 102 as will be explained hereinafter.

Because the attenuated channel 106 continues to provide an output signal after the non-attenuated channel 102 has saturated, the power of the input signals processed by the attenuated channel 106 are higher. Therefore, the attenuated channel (also referred to as the high level channel) functions to compress data received within the high range of the received input signals for extending the dynamic range between (−10) dBm to (+30) dBm. It should further be noted that the size of the resistive attenuator 110 is designed for providing a smooth transition from the low level to the high level channel. The output signals from both the non-attenuated channel 102 and the attenuated channel 106 are delivered to the summation line 108 which directs the combined signal to a video amplifier 132 as is shown in FIG. 3. The video amplifier 132 provides a log video output signal.

The input signals 104 appear at the input terminal 112 and are AC coupled by the capacitor 116 and then attenuated by the input pad 114 comprised of the resistors 118, 119 and 120 for reducing the amplitude of the input signal. Upon reaching the junction node 122 the input signal 104 is caused to be divided with a portion of the input signal being transmitted through a resistor 134 which directs that portion of the signal to the limiter 124. The remaining portion of the input signal is transmitted to the attenuator 110. The resistive attenuator is connected to the output side of input pad 114 for receiving the remaining portion of the input signal. The attenuator is comprised of an adjustable potentiometer which is in electrical communication with the resistor 130 at a node 128 and to electrical ground.

The limiter 124 acts to provide a restricted output voltage in the presence of a high level input such as when an amplifier is in saturation. The limiter includes a pair of limiting diodes 138, 140 oppositely poled with respect to electrical ground. The limiting diodes are designed to conduct to electrical ground. The limiting diodes are designed to conduct electrical current when the input voltage, which acts as a biasing voltage across each diode, exceeds a certain level. Also included is an inductive element 142 which assists in controlling the forward bias on the base element of a transistor 144. The output of the transistor 144 is developed across a resistor 146 and directed to a parallel resistive-inductive component comprised of a resistor 148 and inductor 150 which appear at the entrance of the non-attenuated channel 102. However, the emitter of transistor 144 is connected to a pair of series connected resistors 152 and 154, the common node of which is connected to bypass capacitor 156. The resistor 154 is connected directly to a negative bias voltage (−v).

At this point, the input signals 104 are poised for entry into the first stage of amplification of the non-attenuated channel 102. However, that portion of the input signal directed through the attenuator 110 is delayed in amplitude and has not yet produced output from the last stage of amplification in the attenuated channel 106. In the non-attenuated channel, a voltage is developed across the inductor 150 which sets the bias of a transistor 158 of the first stage of amplification. A resistor 160 connected to the collector of transistor 158 acts to transmit the signal to a resistor 162 in parallel with an inductor 164. The resistor 162-inductor 164 combination provides a tuning circuit for the next stage just as the resistor 148 and the inductor 150 provided a tuning circuit for transistor 158. Likewise, each amplifier stage in both the non-attenuated channel 102 and attenuated channel 106 includes a duplicate tuning circuit. The function of each of the resistive-inductive input circuits is to tune the base-emitter capacitance of subsequent stages and the collector capacitance of the present stage for appropriate response at the frequency of interest. It is noted that the amplified version of the input signals 104 pass from stage one through stage seven of the non-attenuated channel by way of the collector terminal of each of the respective transistors.

The output of each transistor stage (such as transistor 158 of stage one) is taken from the emitter terminal since, in this example, the base-emitter junction acts as a detector for extracting the envelope (video) portion of the amplified signal. Since the base emitter junction is employed as the detector, it is important that the limiter 124 control the input signal from exceeding a certain power level. This is particularly true during the period when the non-attenuated channel 102 saturates and the amplifing stages of the attenuated channel 106 begin to conduct.

Connected to the emitter terminal of transistor 158 is a plurality of electrical components branching out from a node 166. Those components include a bypass capacitor 168 which is utilized for passing all of the I.F. frequency to electrical ground for separating the video component from the I.F. carrier. Further, a resistor 170 is connected to node 166 to act as a bias resistor for connecting the negative bias voltage (−v) to the emitter terminal transistor 158. Finally, a summing resistor 172 connects the emitter terminal at node 166 to the summation line 108. The biasing voltage is at a value below ground reference because of the design employing (NPN) transistors. Each of the remaining stages two through eight forming part of the non-attenuated channel 102 have duplicate components for accomplishing the same function as those of stage one of the non-attenauted channel.

In particular, stage two includes a transistor 174, stage three includes a transistor 176 and continuing through stages seven and eight which include transistors 178 and 180, respectively. Each of the intermediate stages sandwiched between stages two and seven are duplicate to stage one as previously described. Further, collector resistors 182, 184, 186 and 188 are used to develop a voltage signal for the following stage. Each collector resistor transmits the amplified signal to a tuned circuit having resistors 190, 192, 194 and 196 with corresponding inductors 198, 200, 202 and 204 and capacitances associated with the respective adjacent transistors 174, 176, 178 and 180. Finally, each of the remaining stages in non-attenuated channel 102 includes nodes 206, 208, 210 and 212 extending from the emitter terminal of each of the respective transistors.

Connected to the nodes 206, 208, 210 and 212 are bypass capacitors 214, 216, 218 and 220, respectively. Connecting each of the emitter terminals of transistors 174, 176, 178 and 180 to the negative bias voltage (−v) are biasing resistors 222, 224, 226 and 228. Each of the resistive nodes 206, 208, 210 and 212 are connected to the summation line 108 via summing resistors 230, 232, 234 and 236, respectively. It should be noted that the first summing resistor 172 and the last summing resistor 236 are of values different from those of intermediate stages for extending the dynamic range of the logarithmic amplifier 100 by optimizing the high and low end of the response. Identical values of the summing resistors would result in a dynamic curve of equal weighting values. Therefore, the first and last summing resistances of the non-attenuated channel 102 are appropriately scaled for extending the dynamic range and reducing linearity error at both ends of the characteristic transfer curve. Also, the summation line 108 is connected to electrical ground through a pair of capacitors 238, 240 for minimizing the I.F. frequency component from the video envelope. The cumulative signal formed on the summation line 108 is referred to as the "summed video signal" prior to amplification by the video amplifier 132 as shown in FIG. 4.

The resistive attenuator 110 attenuates the input signal 104 to the attenuated (high level) channel so that initiation of signal processing through the attenuated channel is delayed until the non-attenuated channel is in the saturation mode. Resistor 130 is connected to the attenuator divider circuit and is included in the resistive-inductive tuning circuit located at the input of each of the amplifier stages eight through eleven of the attenuated channel 106. Each tuning circuit for stages eight through eleven include the resistor 130 and a plurality of resistors 250, 252, 254 and 256 with corresponding inductors 257, 258, 260, 262 and 264, respectively. Each of the stages include an amplifing transistor 266, 268, 270 and 272, respectively, the base-emitter and collector capacitances of which complete the tuned circuits, resonant at the I.F. frequency of interest.

Connected to the emitter electrode of each of the transistors 266, 268, 270 and 272 are nodes 274, 276, 278 and 280. Each of the nodes are connected to a bypass capacitor 282, 284, 286 and 288, respectively, each of which are grounded. Each of the emitters of the transistors 266, 268, 270 to 272 are connected to the negative bias voltage (−v) through a corresponding bias resistor 290, 292, 294 and 296 respectively. Finally, the emitters of each of the above-mentioned transistors are connected to the summation line 108, through a plurality of summing resistors 298, 300, 302 and 304, respectively.

The summation line 108 which receives the amplified signal from each of the stages in attenuated channel 106 is a continuation of the summation line which receives each of the amplified signals from the stages in the non-attenuated channel 102. The summation line is connected to electrical ground through a plurality of capacitors 301, 303 and 305 for minimizing the I.F. frequency component from the video envelope. A single input line is connected between the summation line and the non-inverting input to the video amplifier 132. Also, the summation line 108 is connected to the negative bias voltage (−v) by way of a resistor 306 and a potentiometer 308 connected to the voltage source (−v). The other end of the potentiometer 308 is connected to electrical ground. The function of the resistor 306 and the potentiometer 308 connected to the negative bias voltage is offset adjustment. This adjustment locates the linear portion of the logarithmic curve along the abscissa.

It should be noted that each of the transistors located in both the non-attenuated channel and the attenuated channel perform multiple functions which include amplifying, limiting and detecting. The combination of bias circuitry located in each of the stages of both channels tend to suppress and attenuate those components of the signal which are undesirable on the summation line 108. The output signal of the logarithmic amplifier is an analog video signal which is later processed to provide a digital video signal. The video signal of interest is an amplified detected signal in the form of an envelope and which is processed to appear on a screen or on any of a plurality of indication instruments.

Referring to both channels, each amplifier stage comprises a Motorola MRF904 high frequency, low noise figure transistor biased at 4 milliamps with a single tuned base and collector for a broad response centered at 31 MHz. The collector and base are at DC ground to allow direct coupling of the cascaded stages. Each stage provides approximately 12 dB of linear gain and is also used as a limiter. The detection characteristics of the transistors base-emitter junction are employed for obtaining the desired detected response of the signal envelope. The logarithmic detected response is obtained by adding the contributions of the emitter of each stage through the respective summing resistors. The summed video signal is then fed to the video amplifier 132 which amplifies and transmits the amplified signal to a buffer 309 for buffering the detected video signal.

The seven stages of the non-attenuated channel 102 provide amplification and successive detection of the input signals 104 from (−80) dBm to (−10) dBm. The input resistive divider attenuator network 110 attenuates the signal to the attenuated channel and prevents detection until the input signal rises above (−10) dBm. This is the point where the parallel stages of the attenuated channel begin the detection process. As the input signal is increased above this level, the limiter 124 located at the front end of the non-attenuated channel 102 limits the signal to the subsequent amplifier stages of the non-attenuated channel. This design prevents overdriving of the front end transistors of the non-attenuated channel by high level signals, thus preventing any contribution to the summed video on the summation line 108 by the non-attenuated channels. Under these conditions, degradation of the high end logarithmic response from the non-attenuated channels is prevented. The actual level at which the attenuated channel 106 just begins detection of the input signals 104 can be adjusted by the resistive attenuator 110. The four stages of the attenuated channel 106 amplify and progressively detected input signals from (−10) dBm to (+30) dBm. This design provides an overall logarithmic response which is extended at the upper end by approximately 40 dB for a total logarithmic dynamic range of 110 dB.

The summed video signal contributions of both channels are transmitted to the non-inverting input of the video amplifier 132 which may be, for example, a PMI OP-37 high-speed Op Amp which amplifies the logarithmic video signal by a factor of 95. The buffer 309 acts as a current buffer and may be a, for example, National LH0063 buffer amplifier which permits driving of the log video output signal into a one-hundred Ohm load. The video output level can be adjusted by a potentiometer 310 which in conjunction with a resistor 312 divides the signal from the video amplifier 132 to the buffer 309. That portion of the circuitry also includes a series resistor 313 connected to the potentiometer 310 and the inverting input of the video amplifier 132. The output video signal provided by the logarithmic amplifier 100 is made available at the output terminal 314.

Figure 5:
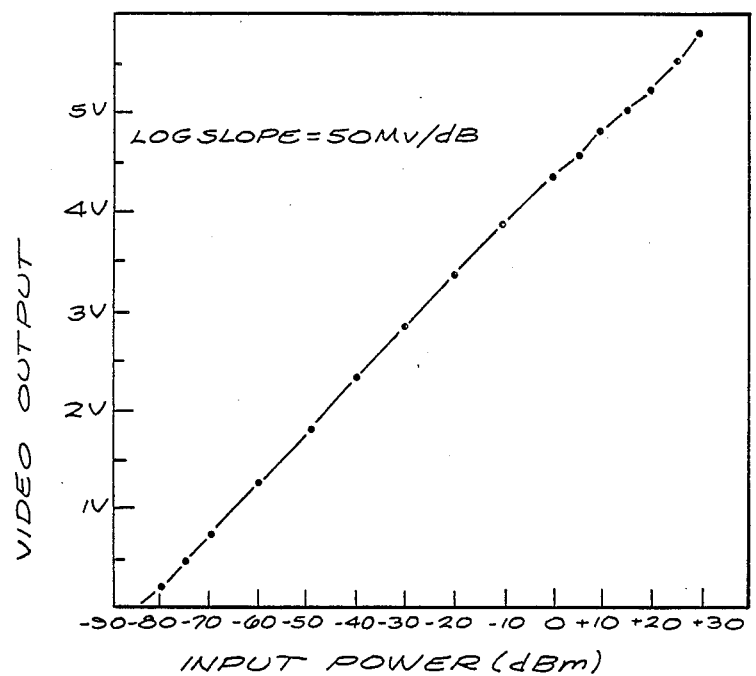
FIG. 5 is a transfer curve of input power versus output voltage level for the logarithmic amplifier of FIG. 3.

The logarithmic response of the logarithmic I.F. amplifier 100 to a 31 MHz signal is graphically shown on FIG. 5. The logarithmic dynamic range illustrated on the horizontal input power axis extends over 110 dB having a maximum logging error of +1.6 dB from an ideal log curve having a 50 mV/dB log slope. As can be seen, the dBm to (+30) dBm. With this range, the video output signal extends from approximately 0.2 volts to 5.8 volts. The corresponding log linearity error is graphically illustrated in FIG. 6 which shows the actual deviation of the illustrated curve in FIG. 5 from a true logarithmic response. The maximum deviation is approximately +1.6 dB.

Because circuit parameters drift when the operating temperature of the circuit changes, temperature compensation is necessary for maintaining the position of the plotted transfer curve under different temperature operating conditions. In particular, the transistor voltages located at the base-emitter junctions tend to vary with changing temperature. Therefore, if a compensation signal is provided to the inverting input of the video amplifier 132, any drift of the video signal on the summation line 108 due to changing temperatures may be nullified.

Temperature compensation is accomplished by summing the emitter voltages of a plurality of six transistors 316, 318, 320, 322, 324 and 326. Each of these transistors includes a capacitor connected across the collector-emitter junction with the capacitors being identified by the numerals 328, 330, 332, 334, 336 and 338. Further, each emitter of the temperature compensation transistors is connected to the negative bias voltage (−v) by way of a plurality of bias resistors 340, 342, 344, 346, 348 and 350. Finally, each of the emitter circuits of the temperature compensation transistors is connected to one of a plurality of compensation summing resistors 352, 354, 356, 358, 360 and 362. Each of the compensation summing resistors is connected directly to a compensation summing line 364 which is in communication with the inverting input of the video amplifier 132. The six temperature compensating transistors 316, 318, 320, 322, 324 and 326 each have their respective collector electrodes connected to ground.

The emitter voltages of the six temperature compensation transistors are combined forming a resultant compensation voltage which is delivered to the inverting input of the video amplifier 132. The temperature compensation transistors can be, for example, Motorola MRF904 models as previously described. Further, the compensation transistor bias current can be chosen to be 9.5 milliamps for tracking the temperature variations of the I.F. amplifier stages.

Figure 6:
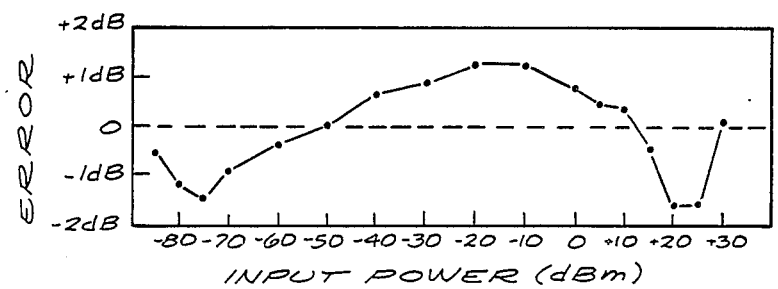
FIG. 6 is a linearity error curve of input power versus deviation error for the logarthimic amplifier of FIG. 3.
Figure 7:
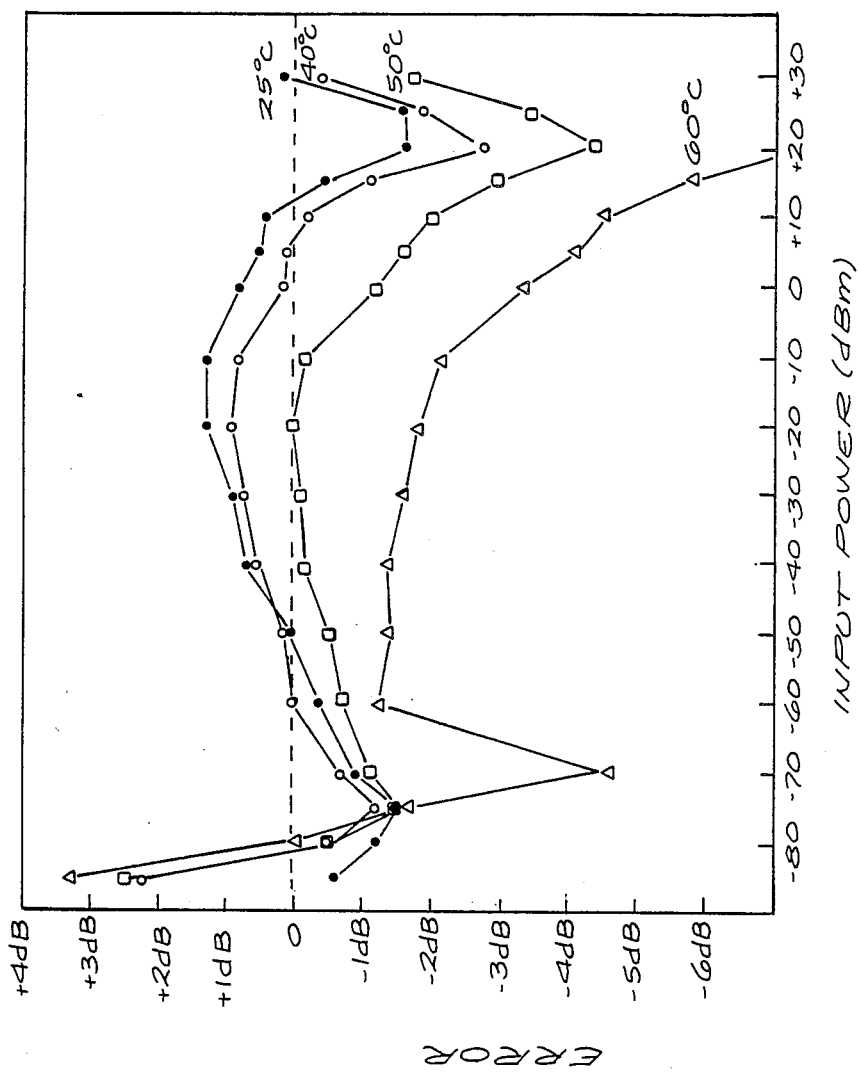
FIG. 7 is a family of temperature response curves of input power versus deviation error at various operating temperatures for the logarthimic amplifier of FIG. 3.

The temperature variations of the 110 dB log I.F. amplifier 100 are shown in FIG. 7. The range of variations are from (+2.5) dB to (−4.3) dB at 50° centigrade, and become significant at 60° C. The different temperature ranges shown generally represent the different operating temperatures of the logarithmic amplifier and are related directly to the curve shown in FIG. 6. The zero line shown in FIG. 6 represents an ideal curve for the transfer characteristic shown in FIG. 5 and variations in the curve of FIG. 6 reflect imperfections or ripples in the linearity of the curve of FIG. 5. The same is true for the family of curves shown in FIG. 7 but for different temperatures over a variety of ranges. Typically, the higher the temperature, the greater the error and the zero reference line represents the ideal transfer characteristic curve for any operating temperature in the range.

The following example describes how the dynamic range is extended by employing operating stages in a parallel channel arrangement. Note that the non-attenuated channel 102 is comprised of stages which are duplicate to those stages of the attenuated channel 106.

If two logarithmic amplifiers are employed, each identical in construction and limited at the upper end by saturation due to high level clutter or signals, the following design is a solution to the problem. If the input signal 104 passes through the input pad 114 and is divided at junction node 122, a portion of the input signal passes to the limiter 124 and into stage one of the non-attenuated channel 102. The remaining portion of the input signal 104 is directed to the resistive attenuator 110 and to stage eight of the attenuated channel 106. The input signal is attenuated in the resistive attenuator for reducing the power level, for example, by 30 dB so that the input signal transmitted to stage eight (transistor 266) of the attenuated channel 106 is approximately 30 dB less than the signal transmitted to stage one of the non-attenuated channel.

If under these conditions, the power level (dBm) of the input signal is increased, then the transistor stages of the non-attenuated channel will saturate first. This action results because the signal strength has not been attenuated and the saturating characteristics of all the stages of both channels are identical. The circuitry is designed so that the resistive attenutor 110 prevents detection by the attenuated channel 106 until the power level of the input signal delivered to stage eight (transistor 266) of the non-attenuated channel rises to (−10) dBm. At this point, the parallel stages of the non-attenuated channel begin the detection process.

Ideally, the attenuated channel 106 will saturate at approximately 30 dB after the saturation of the non-attenuated channel 102. Because the transistor stages of the non-attenuated channel are driven into saturation when the power level of the input signal is increased, the non-attenuated channel generally processes low level power signals and is referred to as the low level channel. However, the delayed detection of the attenuated channel permits the processing of higher power signals resulting in the attenuated channel being referred to as the high level channel.

The outputs of the attenuated channel and the non-attenuated channel are combined on the summation line 108 in a staggered manner. This is the case because the output signals fed through the summing resistors of each of the transistor stages of the non-attenuated channel will develop and transmit an output signal to the summation line prior to the non-attenuated channel being driven into saturation. Subsequently, the output signals developed across the summing resistors of each of the transistor stages of the attenuated channel 106 are delivered to the summation line 108 after the non-attenuated channel 102 has been driven into saturation. Therefore, the sum of the output signals of the two amplifier channels provide an extended dynamic range of the logarithmic I.F. amplifier 100. Although the resistive attenuator 110 located at the input of the attenuated channel 106 causes a reduction in power so that the initial detection response is delayed, an output signal is provided from the attenuated channel after the non-attenuated channel has been driven into saturation. The non-attenuated channel develops a response to the low level portion of the signal strength spectrum before the attenuated channel begins the detection process.

By employing this design, the dynamic range of the logarithmic amplifier 100 is extended to 110 dB for processing higher power input signals (dBm) received from objects of interest. Thus, the instant invention extends the dynamic range at both ends of the transfer characteristic to a maximum peak not previously achieved by logarithmic amplifiers known in the past. Further, the linearity of the extended dynamic range of the logarithmic amplifier 100 is maintained within approximately ±1.6 dB for minimizing the error in the logarithmic curve as is shown in FIG. 6. Also, the circuitry is simplified in comparison to that known in the past since identical stages are utilized in both the non-attenuated channel 102 and the attenuated channel 106. The temperature compensation circuitry illustrated in FIG. 4 improves the stability of the logarithmic curve and the overall extended dynamic range permits the logarithmic amplifier to distinguish input signals of objects of interest from background clutter signals.

It should further be noted that the instant invention employs only a single attenuator which is appropriately scaled followed by a cascade of limiting amplifier detector stages in the attenuated channel 106. The characteristics of those stages are the same as those employed in the low level stages of the non-attenuated channel 102. The logarithmic amplifiers of the past which employed parallel channels could not have used identical stages in both channels because the amplifiers of the past employed multiple attenuators in the signal path. Further, the instant invention is capable of processing input signals having power levels up to one watt. Therefore, the limiter 124 is required at the input of the non-attenuated channel to prevent overload of the channel and to avoid degradation in performance in the presence of such high wattage signals. This feature is unknown in the past. It should further be noted that the log I.F. amplifier 100 is conceptually different from logarithmic video amplifiers known in the past.

An alternative embodiment of a logarithmic I.F. amplifier incorporating the present invention is referred to by the general reference character 400. In this instance, the alternative embodiment of the logarithmic amplifier is illustrated in FIGS. 8A through 11 and is of the dual parallel channel type somewhat similar to the logarithmic amplifier of FIGS. 3 through 7. Parts of the logarithmic amplifier of FIGS. 8A through 11 are designated with numerals beginning with the 400 series, some of which find substantial correspondence in structure and function to parts described in FIGS. 3 through 7.

The log I.F. amplifier 400 was developed with temperature compensation and performance as a main objective. A similar approach of employing dual parallel channels utilizing the successive detection technique is used to extend the log dynamic range. A major refinement in implementation is the use of monolithic bipolar transistor arrays to separate the amplification, limiting and detection functions of each amplification stage such that temperature effects can be treated without compromise. The monolithic nature of the arrays simplifies compensation by equalizing active device temperatures within each stage.

Figure 8A:
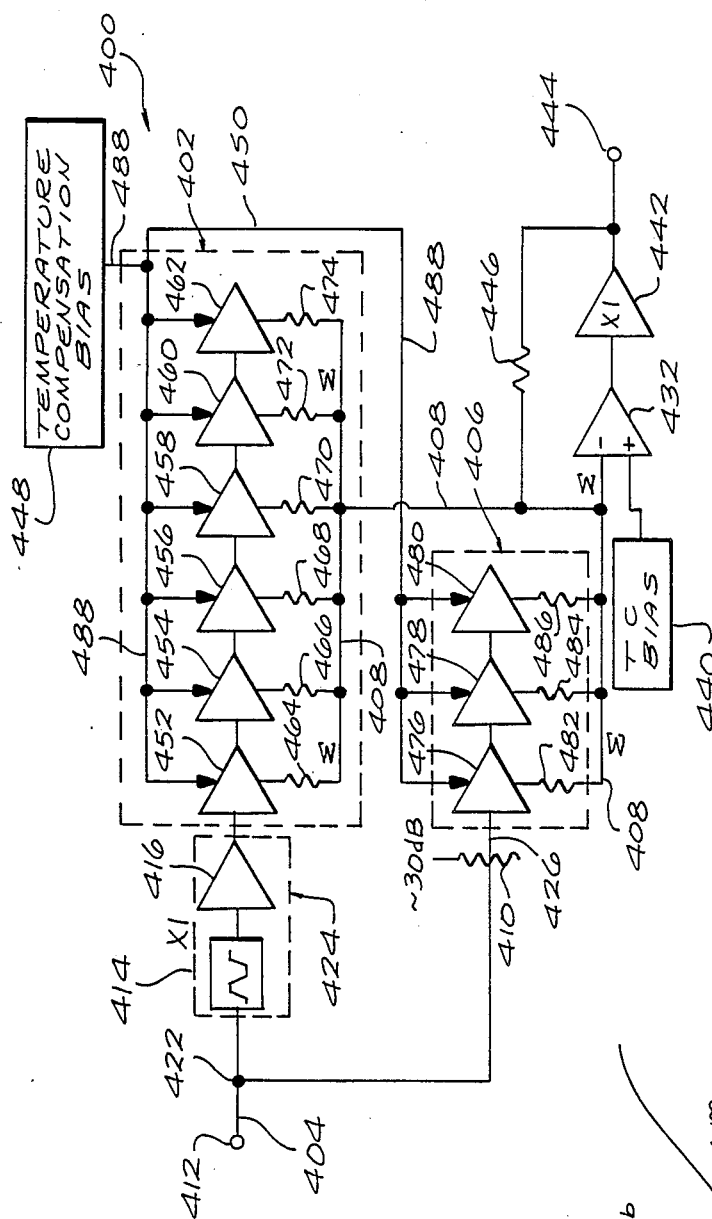
FIG. 8A is a circuit diagram of an alternative embodiment of a logarithmic amplifier of the present invention.
Figure 8B:
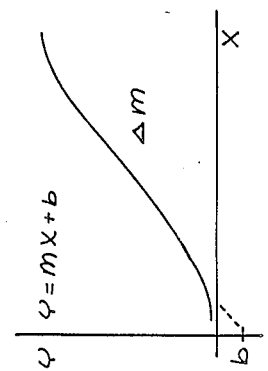
FIG. 8B is a graphical representation illustrating the linear portion of the logarithmic curve for the logarithmic amplifier of FIG. 8A.

A plurality of input signals 404 are received at an input terminal 412 and transmitted to a junction node 422 where the input signal is divided. A portion of the input signal is transmitted to a non-attenuated channel 402 by way of a limiter-buffer 424 as is shown in FIG. 8A. The remaining portion of the input signal 404 is transmitted to an attenuated channel 406 via a resistive attenuator 410. The output signals transmitted from the non-attenuated channel 402 and the attenuated channel 406 are each transmitted to a summation line 408 which delivers the summed output signals of each channel to the inverting input of a video amplifier 432.

A first temperature compensation bias circuit 440 is connected to the non-inverting input of the video amplifier 432 with the output of the video amplifier connected to a buffer amplifier 442 prior to delivery to an output terminal 444. A resistive element 446 is connected between the summation line 408 and the output terminal 444 in a feedback loop. A second temperature compensation bias circuit 448 is connected to a distribution line 450 for transmitting an output signal 488 from the compensation circuit 448 to each stage of both the non-attenuated channel 402 and the attenuated channel 406.

The monolithic array method of the logarithmic amplifier 400 was verified at room temperature using a single limiter-detector stage circuit. The printed circuit of the non-attenuated channel 402 is comprised of six amplifier stages 452, 454, 456, 458, 460 and 462, with each amplifier stage further including a summing resistor 464, 466, 468, 470, 472 and 474 respectively. Upon receiving the input signal 404 at the resistive attenuator 410, an attenuated signal 426 enters the attenuated channel 406 and engages the first of three amplifier stages 476, 478 and 480. Each stage 476, 478 and 480 includes a summing resistor 482, 484 and 486 respectively. Each of the amplifying stages in the non-attenuated channel 402 and the attenuated channel 406 receive a temperature correction signal 488 for operating with temperature variation compensation.

The first temperature compensation bias circuit 440 has an output signal which is directed to the non-inverting terminal of the video amplifier 432. This compensation output signal directly affects the vertical axis intercept point (designated by the letter (b)) of the linear portion of the transfer curve having a changing slope ($\Delta m$). Both the ($\Delta m$) and (b) parameters are components of the equation (1) for a straight line as shown in the graphical representation in FIG. 8B. The printed circuit comprised of the six cascaded stages in the non-attenuated channel in parallel with the three cascaded stages of the attenuated channel exhibit flexibility for allowing empirical determination of parameters that cannot be readily established analytically. The detailed schematic diagram of the log I.F. amplifier 400 includes each of the major components which illustrate the novel and non-obvious aspects of the present invention as distinguished from the logarithmic amplifier 100.

The input signals 404 are received at the input terminal 412 and divided at the junction node 422. That portion of the input signal directed to the non-attenuating channel 402 is initially received by a limiter 414 and a buffer 416 of the limiter-buffer 424 while that portion of the input signal directed to the attenuated channel 406 is initially fed to the resistive attenuator 410. In order to obtain a smooth transistion to the attenuated channel 406 from the non-attenuated channel 402, the input signal to the non-attenuated (low level) channel must be accurately controlled for maintaining a constant limit level as the input signals 404 are increased. This is accomplished by employing the limiter 414 (also known as a unity gain small signal pre-limiter) which has a limit level comparable to that of other stages. The limiter 414 or pre-limiter is comprised of a pair of NPN transistors 490, 492 which are connected as a differential pair with each having a resistor 494, 496 connected to their respective emitter electrodes. The base terminal of transistor 492 is connected to electrical ground through a resistor 498 while the collector terminal is connected through a resistor 500 to a positive bias voltage (+v) along with the collector terminal of transistor 490. The collector of transistor 490 is connected to ground through a capacitor 502.

A pair of resistors 504, 506 form a voltage divider network having a node 508 connected to the base electrode of a bias transistor 510. The collector terminal of transistor 510 is connected to a common point of each resistor 494, 496 connected to the respective transistors 490, 492 of the limiter 414. The emitter electrode of transistor 510 is connected through a pair of resistors 512, 514 to the emitter electrodes of a pair of transistors 516, 518 forming the buffer 416. The base electrode of the buffer transistor 516 is connected to the collector electrode of the limiter transistor 492 while the collector terminal of transistor 516 is connected to the positive bias voltage (+v) and to the capacitor 502. Note that the collector and base electrodes of limiter transistor 518 are shorted together. The limiter-buffer 424 does not include a detector and is connected to stage one of the non-attenuated channel 402 through a capacitor 520 employed for blocking undesirable DC bias components.

A voltage regulator 524 is shown connected to the negative bias voltage (−v) at a node 526. A resistor 528 and capacitor 530 are each shown connected to the node 526. The capacitor 530 is also shown connected to electrical ground while the resistor 528 is connected to resistor 506 of the limiter 414 and to transistors 510, 516 and 518 via resistors 512 and 514. The voltage regulator 524 is also connected to electrical ground through a pair of resistors 532, 534 with a center node 536 connecting the voltage regulator circuit to the base electrode of amplifier stage seven 476 of attenuated channel 406 through a resistor 538.

The output of the voltage regulator 524 provides a regulated voltage ($-v_R$) which is impressed through the voltage divider combination of resistors 532, 534 and resistor 538 to the base electrode of amplifier stage seven 476 of the attenuated channel 406. The signal received from the limiter-buffer 424 is impressed upon the base electrode of a transistor 540 which is the first of a differential pair of transistors 540, 542. Also connected to the base of transistor 540 is a resistor 544 which along with resistor 538 at the input of amplifier stage seven 476 serve to bias the first differential transistor pair of each stage.

The transistor array utilized for each stage in the non-attenuated channel 402 and the attenuated channel 406 is a high frequency, NPN, Plessey SL3145 transistor array, with five matched transistors. Transistors 540, 542 are employed as a differential pair with a single ended output for providing gain with non-saturating limiting. The differential pair is employed for I.F. signal amplification, the pair of transistors having superior temperature performance capabilities as compared to a single stage transistor. A resistor 546 which is connected to the distribution line 450 of the second temperature compensation bias circuit 448 is also connected to the base of a bias transistor 548. The function of resistor 546 is to set the operating point of the bias transistor 548 which is connected to each of the emitter electrodes of the differential transistor pair 540, 542.

The transistor 548 is employed as a constant current sink that establishes the quiescent current of the differential pair 540, 542 with the base electrode of transistor 548 providing a means for maintaining a constant gain-limiting level with temperature variations. This is accomplished by employing a temperature compensation bias source which is provided by a transistor 550 located within the second temperature compensation bias circuit 448. The temperature compensated bias voltage (B) is common to all stages of both the non-attenuated channel 402 and the attenuated channel 406.

A transistor 552 connected directly to the collector electrode of transistor 542 of the differential pair is employed as a common collector buffer. The transistor 552 is utilized for providing a high drive current to the subsequent stage, and to an isolation resistor 554, and to a detector transistor 556 of the transistor array. A temperature compensated bias source manifested in a transistor 558 located within the second temperature compensation bias circuit 448 is common to each stage as a voltage (A) present at the base electrode of each detector transistor. In stage one, the temperature compensated voltage (A) is used for compensating the voltage of transistors 552, 556. The temperature compensated voltage (A) is likewise employed in each of the remaining stages.

Transistor 552 is a current amplifier which provides a current gain for driving subsequent stages in cascade and for driving the detector transistor 556. Sufficient current gain is required for driving the detector transistor for insuring the development of the stage output signal with a specific load. Further, transistor 552 is employed as a buffer for isolating the output circuitry of the subsequent stage from the input circuitry of the preceding stage.

Detector transistor 556 is specifically employed for detecting the envelope of the I.F. signal (a function similar to that performed by the transistor base-emitter junctions of logarithmic amplifier 100). Note that the I.F. signal passes through to stage two but the video signal is transmitted directly to the summation line 408. A bias voltage (c) is applied to the base terminal of transistor 540 of the differential pair by the resistor 544. The resistor 544 functions to set the steady-state operating point of each stage of the non-attenuated (low level) channel. The same function is performed by the resistor 538 connected to the base electrode of amplifier stage seven 476 of the attenuated channel 406.

A pair of resistors 560, 562 are employed for providing DC level shift such that the proper quiescent collector voltage of differential pair transistor 542 exists with the proper DC level at the I.F. output. Successive stages two through six are DC coupled for better transient response. The I.F. gain of each stage is set to approximately 13 dB.

A resistor 564 is connected between the emitter terminals of amplifying transistor 552 and detector transistor 556 for assisting in the linearizing of the detected output signal of transistor 556 which is operated in the common-base configuration for minimizing input capacitance. The base of the detector transistor in each stage is supplied with the compensated voltage (A) by the temperature compensation bias source transistor 558. The voltage (A) serves to match temperature characteristics for yielding a detected output current independent of temperature. The summing resistor 464 and a capacitor 568 are combined to form a video carrier filter that prevents stage-to-stage feedback via the common video summation line 408. A capacitor 570 suppresses AC feedback thus creating a hyperbolic transfer characteristic as opposed to a linearized transfer characteristic that would result if significant AC feedback occurred. The resultant hyperbolic function matches the logarithmic curve better than a linearized response and yields a better logarithmic approximation for the same number of stages. Equivalently, fewer stages are required for comparable logarithmic accuracy.

Amplifier stage one 452 further includes a capacitor 572 connected between electrical ground and the voltage source (c), a resistor 574 connected between the base and collector electrodes of transistor 552, and a resistor 576 connected between the emitter electrode of bias transistor 548 and a node 578 connected to the voltage regulator source ($-v_R$) which is connected to electrical ground through a capacitor 580. Finally, the base electrode of the detector transistor 556 is connected to the compensated bias voltage (A) and to electrical ground through a capacitor 582.

Figure 9:
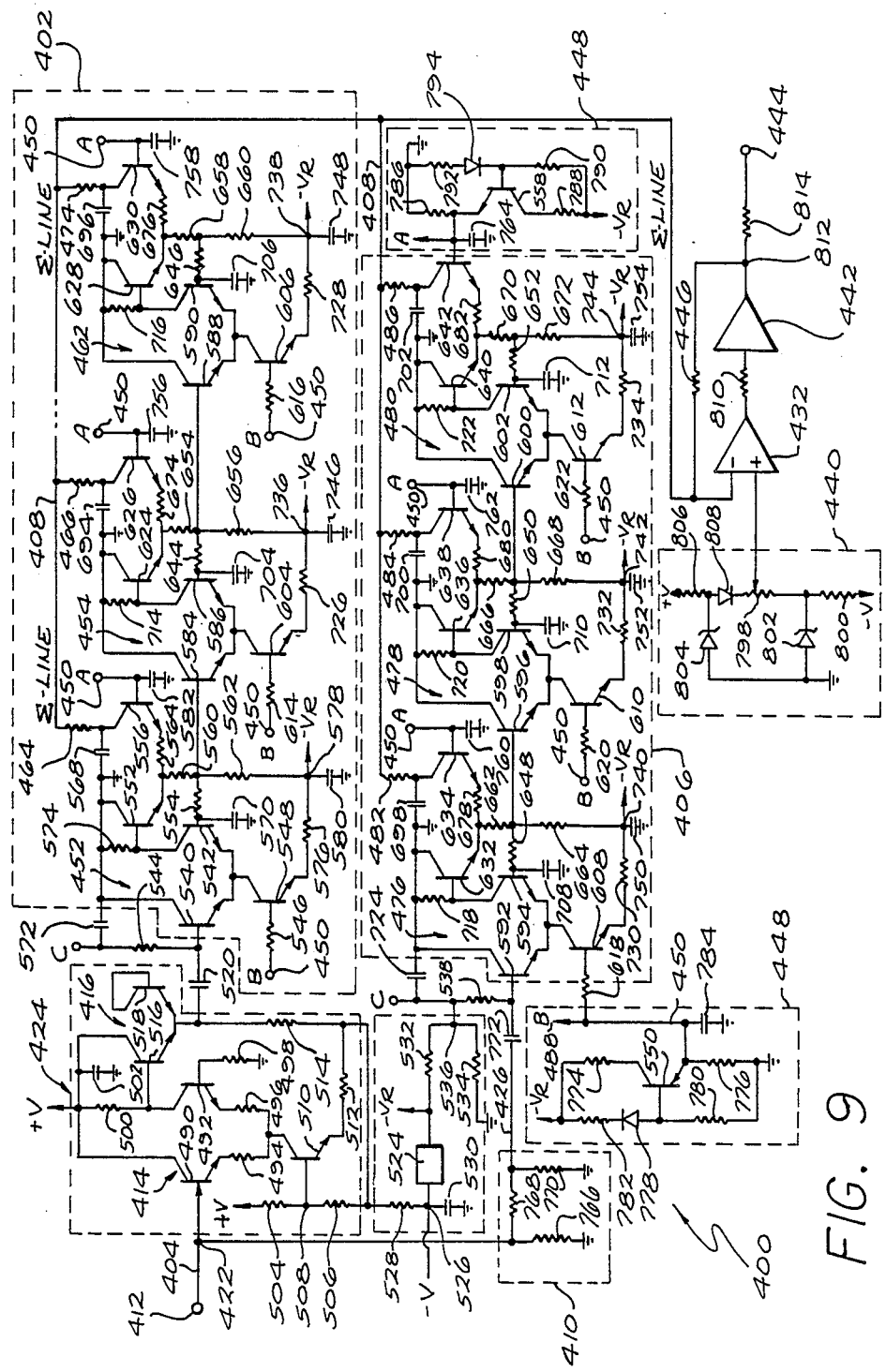
FIG. 9 is a detailed circuit diagram of the logarithmic amplifier of FIG. 8A.

The five remaining stages two through six of the non-attenuated channel 402 and stages seven through nine of the attenuated channel 406 are comprised of duplicate components having duplicate functions as those described in stage one of the non-attenuated channel as shown in FIG. 9. Those components may be identified in the following manner. The differential transistor pairs for stages two, six and seven through nine are transistor 584, 586 in stage two, transistors 588, 590 in stage six, transistors 592, 594 in stage seven, transistors 596, 598 in stage eight, and transistors 600, 602 in stage nine. Corresponding bias transistors include transistors 604, 606, 608, 610, and 612 each having a base electrode connected resistor 614, 616, 618, 620, and 622 respectively.

Further, each stage includes a current amplifying transistor and a detector transistor identified by the numerals 624, 626 in stage two, 628, 630 in stage six, 632, 634 in stage seven, 636, 638 in stage eight, and 640, 642 in stage nine. Further, each of the remaining stages two through six and seven through nine includes an isolation resistor 644, 646, 648, 650 and 652 respectively. The quiescent collector voltage resistors for the remaining stages include resistors 654, 656 in stage two, resistors 658, 660 in stage six, resistors 662, 664 in stage seven, resistors 666, 668 in stage eight, and resistors 670, 672 in stage nine.

Each of the remaining stages designated by stages two, six, and seven through nine as shown on FIG. 9 further include a linearizing resistor 674, 676, 678, 680, and 682. Also included is the resistor-capacitor pair forming the video carrier filter identifed by the summing resistors 466, 474, 482, 484 and 486 with corresponding capacitors 694, 696, 698, 700 and 702 respectively. Further, each of the remaining stages includes a suppression capacitor 704, 706, 708, 710, and 712 respectively. Each stage also includes a resistor connected between the base and collector electrodes of the current amplifying transistor identified by numerals 714, 716, 718, 720, and 722 respectively. The input to amplifier stage seven 476 includes a capacitor 724 which serves to block any undesirable components in the voltage source (c).

Finally, each of the remaining stages includes a resistor connected to the emitter electrode of each of the biasing transistors, including resistors 726, 728, 730, 732, and 734, each of the resistors being connected to a corresponding node 736, 738, 740, 742, and 744 respectively. Connected to each of the nodes is the regulated voltage ($-v_R$) and a capacitor connected to electrical ground with the capacitors identified by the numerals 746, 748, 750, 752, 754 respectively. Finally, connected to the base electrode of each detector transistor is the compensated voltage (A) connected through a capacitor to electrical ground, the capacitors being identifed by the numerals 756, 758, 760, 762, and 764 respectively.

That portion of the input signal 404 which is transmitted to the attenuated channel 406 is directed from the junction node 422 to the resistive attenuator. The resistive attenuator is comprised of resistors 766, 768, and 770 with resistors 766 and 770 being connected to electrical ground. The output of the resistive attenuator 410 provides a voltage signal which is substantially delayed in amplitude. The signals received by the attenuated channel 406 have been progressively amplified with each stage providing an output signal to the summation line 408. The resistive attenuator is designed so that the attenuated channel 406 does not begin to amplify and process the delayed input signal until the respective stages of the non-attenuated channel have been driven into saturation. The voltage signal available at the output of the resistive attenuator 410 is impressed upon the base electrode of the transistor 592 of the differential pair of amplifier stage seven 476. A capacitor 772 is located between the base electrode of transistor 592, and the output terminal of attenuator 410 for blocking undesirable bias voltage components to the input signal.

Once the delayed signal from the atteuator 410 is delivered to amplifier stage seven 476 of the attenuated channel 406, output signals from stages seven, eight and nine, respectively, are transmitted to the summation line 408 after the non-attenuated channel 402 has been driven into saturation. The detected video current signals of the six stages of the non-attenuated channel and the three stages of the attenuated channel are parallel connected to yield the composite detected logarithmic video signal on the summation line 408. This design provides an advantage in that the voltage division effect caused by the resistive summation of the detected video signals in the logarithmic amplifier 100 is avoided.

The second temperature compensation bias circuit 448 is shown in detail in FIG. 9. Each stage of both of the channels is supplied with a voltage from the temperature compensated bias sources. The temperature compensation bias transistor 550 is included within the second temperature bias compensation circuit and includes a resistor 774 connected to the collector electrode of the transistor 550 and a resistor 776 connected to the emitter electrode thereof. Further, the base electrode is connected to the anode of a diode 778 and is also connected to a resistor 780. The cathode of the diode 778 is connected to a resistor 782 which in combination with resistor 774 is connected to the negative regulated voltage ($-v_R$).

The emitter electrode of temperature compensated bias transistor 550 is also connected to a grounded capacitor 784 at one end. The temperature compensated voltage (B) is also directed to the base electrode of each biasing resistor of each stage as is shown in FIG. 9. The type of temperature compensation provided by the temperature compensated bias source 448 is referred to as (m-type) which is distinguishable from the type of temperature compensation associated with the first temperature compensation bias circuit 440.

The temperature compensation bias source transistor 558 provides a similar structure to that provided by transistor 550 except that transistor 558 is on NPN type while transistor 550 is a PNP type. Structure associated with transistor 558 comprises a series of resistors including resistor 786 connected to the emitter electrode of transistor 558 while a resistor 788 is connected to the collector electrode. Connected to the base of transistor 558 is a resistor 790 which in combination with resistor 788 is connected to the negative regulated voltage ($-v_R$).

Connected to electrical ground and to resistor 786 is another resistor 792 which is also connected to the anode of a diode 794. The cathode of diode 794 is connected to the base of transistor 558. Also connected to the emitter electrode is the capacitor 764 which is tied to electrical ground. The output of the temperature compensation bias source transistor 558 is the temperature compensated bias voltage (A) which is also provided to the base electrode of each detector transmitter in each stage. The compensated voltage (A) is part of the second temperature compensation bias circuit 448 as is shown in FIG. 9.

The first temperature compensating bias circuit 440 is comprised of a potentiometer 798 which is connected to a non-inverting input of the video amplifier 432. Connected to the potentiometer is a resistor 800 in electrical contact with the negative bias voltage ($-v$). Also connected to the potentiometer is the cathode of a first reference diode 802, the anode of which is connected to electrical ground as is the anode of a second reference diode 804. The cathode of the second reference diode 804 is connected to a positive bias voltage ($+v$) through a resistor 806. The cathode of the second reference diode 804 is also connected to the anode of a diode 808, the cathode of which is connected directly to the potentiometer 798.

Figure 10:
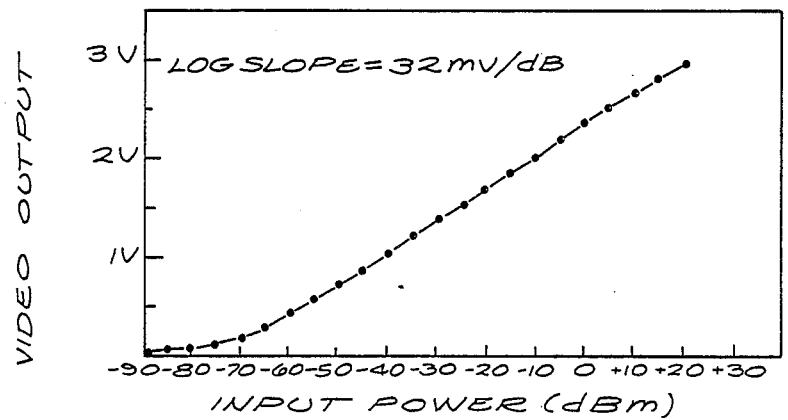
FIG. 10 is a transfer curve of input power versus output voltage level for the logarithmic amplifier of FIG. 9.

The first temperature compensation bias circuit 440 provides a "b-type" compensation which adjust the slope of the logarithmic amplifier transfer characteristic as is shown in FIG. 10. The (b-type) temperature compensation controls where the transfer curve will cross the vertical axis (Y-intercept). By providing the (b-type) temperature compensation signal to the video amplifier 432, the vertical components of the transfer characteristic may be properly altered to minimize offset changes due to temperature variations. Note that the sense of polarity of the temperature compensating signals fed to the video amplifier 432 are inverted from that of the logarithmic amplifier 100 shown in FIG. 4. The polarity reversal occurs because of the electrical connections of the detector transistor of each amplifying stage.

The slope of the logarithmic curve decreases at high temperature because of the increased sensitivity of the differential pairs due to a drop in the base-emitter voltage. Therefore, a change in the resistive attenuator 410 is required so that the stages seven through nine of the attenuated channel 406 begin to process the input signals 404 at the correct level. Failure to incorporate this design will result in temperature variations which cause the logarithmic transfer curve to vary up or down near the cut-in point of the attenuated channel. Rather than compensating the lower level to high level attenuation and video gain, the problem is corrected by reducing the gain of the differential pair in each stage with increasing temperature. This is accomplished by decreasing the base-emitter voltage of the bias transistor by a value greater than the base-emitter voltage drop of the differential transistor pair.

The video amplifier 432 consists of a wide bandwidth operational amplifier having the unity gain buffer amplifier 442 included within a feedback loop for eliminating DC baseline shift due to the temperature response of the buffer 442. A balanced style reference using dual precision monolithic diodes is used to compensate other video amplifier temperature effects. The video amplifier and the buffer amplifier are separated by a resistor 810 while a node 812 on the output side of the buffer serves as a junction point for the feedback loop. The loop includes the feedback resistor 446 connected between the node 812 and the inverting input of the video amplifier 432. An output resistor 814 is employed for isolating the video buffer 442 from the load. The output signal is available at the output terminal 444.

The logarithmic response of the logarithmic I.F. amplifier 400 at 31 MHz is shown in FIG. 10. The logarithmic dynamic range is only measured from approximately ($-80$) dBm to ($+20$) dBm. Because the maximum input level of the equipment employed for testing the logarithmic amplifier 400 was limited, the test was only conducted to ($+20$) dBm. The test equipment did not exploit the maximum capability of the logarithmic amplifier 400 illustrated in FIG. 9. This resulted in the logarithmic transfer characteristic being linear in the range from approximately ($-75$) dBm to ($+20$) dBm. If the equipment employed to test the logarithmic amplifier 400 were not limited, it is expected that the response would be logarithmic up to ($+30$) dBm for a total logging range in excess of 95 dB.

Figure 11:
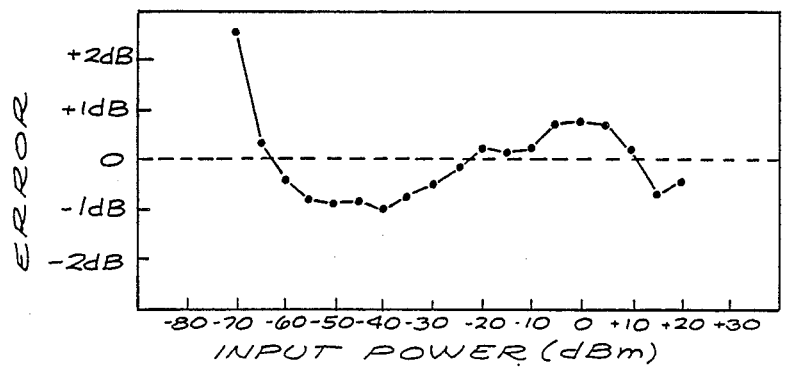
FIG. 11 is a linearity error curve of input power versus deviation error for the logarithmic amplifier of FIG. 9.

The logarithmic linearity of the transfer characteristic shown in FIG. 10 is illustrated in FIG. 11. The linearity curve of FIG. 11 exhibits a $\pm 1$ dB logging linearity at a 32 mV/dB slope. The linearity of the logarithmic amplifier 400 approaches the ideal zero axis in the range of approximately ($-70$) dBm to ($+20$). It will be noted that less deviation exists from a truly linear transfer characteristic of the logarithmic amplifier 400 as compared to the linearity exhibited in FIGS. 6 and 7 for the logarithmic amplifier 100.

It should be noted that even though the logarithmic I.F. amplifiers of the preferred and alternative embodiments were developed for extending the dynamic range of a radar receiver, the novel and non-obvious invention can also be employed in other applications. Examples of other applications are those which require compression of large dynamic range I.F. signals into a narrow, workable range. Such a use may be found in, for example, spectrum analyzers and network analyzers.

From the foregoing, it will be appreciated that the logarithmic amplifier of the present invention extends the dynamic range at both ends of the transfer characteristic to a maximum peak not previously achieved for permitting identification of received input signals higher than large background clutter. The amplifier also improves the capability of processing higher power input signals received from objects of interest. Further, a maximum logarithmic curve variation of approximately 1.6 dB minimizes error while the amplifier construction employs identical amplifying stages in both the non-attenuated (low level) and the attenuated (high level) channels for promoting economy and commonality. Temperature compensation circuity is employed for improving stability and in the alternative embodiment enhances stability over various temperature ranges.

While various particular forms of the invention have been illustrated and described, it will be apparent that various modifications can be made without departing from the spirit and scope of the invention. Accordingly, it is not intended that the invention be limited, except as by the appended claims.

We claim:

1. A logarithmic intermediate frequency amplifier comprising, in combination:
    means for receiving an input signal, said input signal being a first signal and a second signal;

means for limiting the amplitude of said first signal below a threshold power level, said limiting means being coupled to said receiving means;

means for amplifying said limited first signal, said first signal amplifying means being coupled to said limiting means and comprising a plurality of identical stages with each stage providing a detected response signal to a summing means, said first signal amplifying means providing a first dynamic range component;

means for attenuating said second signal, said attenuating means being coupled to said receiving means for preventing amplification and detection of said second signal until said second signal exceeds said threshold power level;

means for amplifying said attenuated second signal, said second signal amplifying means being coupled to said attenuating means and comprising a plurality of stages identical to and in parallel with said stages of said first signal amplifying means with each stage providing a detected response signal to said summing means, said second signal amplifying means providing a second dynamic range component; and means for amplifying said detected response signals received from said summing means for providing a video output signal, said video output signal comprised of said first and second dynamic range components for extending the dynamic range of the logarithmic amplifier to 110 dB and for detecting an extended range of said input signal and wherein said logarithmic amplifier further includes a temperature compensating means for providing a compensating voltage signal for minimizing operating temperature variations.

2. The logarithmic intermediate frequency amplifier of claim 1 wherein said receiving means comprises an input terminal.

3. The logarithmic intermediate frequency amplifier of claim 1 wherein said limiting means comprises a solid state circuit for preventing the overdriving of said first signal amplifying means when said input signal exceeds said threshold power level.

4. The logarithmic intermediate frequency amplifier of claim 1 wherein said limiting means comprises a solid state circuit for preventing the degrading of the detected response above the saturating power level of said first signal amplifying means.

5. The logarithmic intermediate frequency amplifier of claim 1 wherein said threshold power level is $(-10)$ dBm.

6. The logarithmic intermediate frequency amplifier of claim 1 wherein said first signal amplifying means comprises a plurality of cascaded, transistor amplifying stages with said first signal being amplified and transmitted from a first electrode to each succeeding stage of said first signal amplifying means and said detected response being transmitted from a second electrode to said summing means.

7. The logarithmic intermediate frequency amplifier of claim 1 wherein said first dynamic range component of said first signal amplifying means comprises said first signal within a range of from $(-80)$ dBm to $(-10)$ dBm.

8. The logarithmic intermediate frequency amplifier of claim 1 wherein said attenuating means comprises an adjustable resistive attenuator for preventing amplification and detection of said second signal not exceeding a power level of $(-10)$ dBm.

9. The logarithmic intermediate frequency amplifier of claim 1 wherein said second signal amplifying means comprises a plurality of cascaded transistor amplifying stages with said second signal being amplified and transmitted from a first electrode to each succeeding stage of said second signal amplifying means and said detected response being transmitted from a second electrode to said summing means.

10. The logarithmic intermediate frequency amplifier of claim 1 wherein said second dynamic range component of said second signal amplifying means comprises said second signals within a range of from $(-10)$ dBm to $(+30)$ dBm.

11. The logarithmic intermediate frequency amplifier of claim 1 wherein said summing means comprises a summation line for receiving said detected response signals from a plurality of summing resistors connected to said first and said second signal amplifying means.

12. The logarithmic intermediate frequency amplifier of claim 1 wherein said logarithmic video signal amplifying means comprises an operational amplifier, said operational amplifier being coupled to said summing means and coupled to a temperature compensation bias circuit.

13. A logarithmic intermediate frequency amplifier comprising, in combination:

a receiving circuit for receiving input signals, said input signals being coupled to separate paths providing a first signal and a second signal;

a limiter circuit in being coupled to said receiver circuit, said limiter circuit for limiting the amplitude of said first signal below a threshold power level;

a first plurality of amplifier stages being coupled to said limiter circuit for amplifying said limited first signal, with each amplifier stage being identically comprised of a single transistor and providing a detected response signal to a summation line, said first plurality of amplifier stages providing a first dynamic range component;

an attenuator being coupled to said receiving circuit for attenuating and for preventing amplification and detection of said second signal until said second signal exceeds said threshold power level;

a second plurality of amplifier stages being coupled to said attenuator for amplifying said attenuated second signal with each amplifier stage being identical to and in parallel with said single transistor amplifier stages of said first plurality of amplifier stages and providing a detected response signal to said summation line, said second plurality of amplifier stages providing a second dynamic range component;

a temperature compensation bias circuit for providing a compensating signal for operating temperature variations; and a video amplifier for receiving said detected response signals from said summation line and said compensating signal from said temperature compensation bias circuit for providing a video output signal, said video output signal comprised of said first and second dynamic range components for extending the dynamic range of the logarithmic amplifier for detecting an extended range of said input signals.

14. The logarithmic intermediate frequency amplifier of claim 13 wherein said extended range of said input signals comprises a range of from (−80) dBm to (+30) dBm.

15. The logarithmic intermediate frequency amplifier of claim 13 further including a buffer amplifier being coupled to said video amplifier for driving the video output signal to a specific load resistance.

16. The logarithmic intermediate frequency amplifier of claim 14 further including a potentiometer connected to said video amplifier for controlling the magnitude of the video output signal.

17. A logarithmic intermediate frequency amplifier comprising, in combination:
- a receiving circuit for receiving input signals, said input signals being coupled to separate paths providing a first signal and a second signal;
- a limiter circuit in being coupled to said receiver circuit, said limiter circuit for limiting the amplitude of said first signal below a threshold power level;
- a first plurality of amplifier stages being coupled to said limiter circuit for amplifying said limited first signal, with each amplifier stage being identically comprised of a transistor array and providing a detected response signal to a summation line, said first plurality of amplifier stages providing a first dynamic range component;
- an attenuator being coupled to said receiving circuit for attenuating and for preventing amplification and detection of said second signal until said second signal exceeds said threshold power level;
- a second plurality of amplifier stages being coupled to said attenuator for amplifying said attenuated second signal with each amplifier stage being identical to and in parallel with said transistor array amplifier stages of said first plurality of amplifier stages and providing a detected response signal to said summation line, said second plurality of amplifier stages providing a second dynamic range component;
- a common temperature compensation bias circuit being coupled to each stage of said first and second plurality of amplifying stages for providing a plurality of first temperature compensating signals to each of said transistor arrays;
- an output temperature compensation bias circuit for providing a second temperature compensating signal to said logarithmic amplifier; and
- a video amplifier for receiving said detected response signals and said second temperature compensating signal from said output temperature compensation bias circuit for providing a video output signal, said video output signal comprised of said first and second dynamic range components for extending the dynamic range of the logarithmic amplifier for detecting an extended range of said input signals.

18. The logarithmic intermediate frequency amplifier of claim 17 wherein said transistor array comprises a monolithic bipolar array having five transistors.

19. The logarithmic intermediate frequency amplifier of claim 17 wherein said limiter circuit comprises a unity gain pre-limiter for maintaining a constant limit level when the amplitude of said input signal increases for providing a smooth transistion from said first to said second plurality of amplifier stages.

20. The logarithmic intermediate frequency amplifier of claim 17 wherein said video amplifier is comprised of a wide bandwidth operational amplifier.

21. The logarithmic intermediate frequency amplifier of claim 17 wherein said extended range of said input signals comprises a range of at least from (−75) dBm to (+20) dBm.

22. A method for extending the dynamic range of a logarithmic intermediate frequency amplifier, said method comprising the steps of:
- receiving an input signal, said input signal being coupled to separate paths providing a first signal and a second signal;
- limiting the amplitude of said first signal below a threshold power level for providing a limited first signal within a fixed range;
- amplifying said limited first signal with a first plurality of amplifying stages with each stage being identical and providing a detected response signal to a junction for summing said response signals and for providing a first dynamic range component;
- attenuating said second signal for preventing amplification and detection of said second signal until said second signal exceeds said threshold power level;
- amplifying said attenuated second signal with a second plurality of amplifying stages with each stage being identical to and in parallel with said first plurality of amplifying stages and providing a detected response signal to said junction for summing said response signals and for providing a second dynamic range component;
- amplifying said detected response signals received from said junction for providing a video output signal, said video output signal comprised of said first and second dynamic range components for extending the dynamic range of the logarithmic amplifier to 110 dB and for detecting an extended range of said input signal and
- providing an output temperature compensation signal to said logarithmic amplifier for compensating said video output signal for variations in the operating temperature.

23. The method as recited in claim 22 further including the step of providing a common temperature compensation signal to each of said first and second plurality of amplifying stages for compensating each stage for variations in the operating temperature.

* * * * *